United States Patent
Morero et al.

(10) Patent No.: US 10,063,262 B2
(45) Date of Patent: *Aug. 28, 2018

(54) NON-CONCATENATED FEC CODES FOR ULTRA-HIGH SPEED OPTICAL TRANSPORT NETWORKS

(71) Applicant: Inphi Corporation, Santa Clara, CA (US)

(72) Inventors: Damian Alfonso Morero, Cordoba (AR); Mario Alejandro Castrillon, Cordoba (AR); Matias German Schnidrig, Bialet Masse (AR); Mario Rafael Hueda, Cordoba (AR)

(73) Assignee: INPHI CORPORATION, Santa Clara, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 15/000,978

(22) Filed: Jan. 19, 2016

(65) Prior Publication Data

US 2016/0134305 A1 May 12, 2016

Related U.S. Application Data

(60) Continuation-in-part of application No. 14/561,183, filed on Dec. 4, 2014, now Pat. No. 9,608,666, which is a division of application No. 13/406,452, filed on Feb. 27, 2012, now Pat. No. 8,918,694.

(60) Provisional application No. 61/447,620, filed on Feb. 28, 2011, provisional application No. 62/107,171, filed on Jan. 23, 2015.

(51) Int. Cl.
*H03M 13/00* (2006.01)
*H03M 13/11* (2006.01)

(52) U.S. Cl.
CPC ....... *H03M 13/616* (2013.01); *H03M 13/112* (2013.01); *H03M 13/116* (2013.01); *H03M 13/1137* (2013.01); *H03M 13/6577* (2013.01)

(58) Field of Classification Search
CPC ............. H03M 13/616; H03M 13/112; H03M 13/1137; H03M 13/116; H03M 13/6577
See application file for complete search history.

(56) References Cited

U.S. PATENT DOCUMENTS 6,947,109 B2 * 9/2005 Lee ................... G02F 1/133553
349/113
6,948,109 B2 9/2005 Coe
(Continued)

OTHER PUBLICATIONS

Chen, J. et al., "Reduced-Complexity Decoding of LDPC Codes," IEEE Transactions on Communication, Aug. 2005, pp. 1288-1299, vol. 53, No. 8.

(Continued)

*Primary Examiner* — Thien Nguyen
(74) *Attorney, Agent, or Firm* — Richard T. Ogawa; Ogawa P.C.

(57) ABSTRACT

A decoder performs forward error correction based on quasi-cyclic regular column-partition low density parity check codes. A method for designing the parity check matrix reduces the number of short-cycles of the matrix to increase performance. An adaptive quantization post-processing technique further improves performance by eliminating error floors associated with the decoding. A parallel decoder architecture performs iterative decoding using a parallel pipelined architecture.

17 Claims, 18 Drawing Sheets

(56) References Cited

U.S. PATENT DOCUMENTS

| | | | | |
|---|---|---|---|---|
| 8,347,172 | B2* | 1/2013 | Kwon | H03M 13/114 714/755 |
| 2003/0140302 | A1* | 7/2003 | Litwin, Jr. | G11L 320/1029 714/784 |
| 2005/0183092 | A1* | 8/2005 | Christensen | G06F 9/546 719/313 |
| 2006/0052513 | A1* | 3/2006 | Butz | C08F 293/00 524/555 |
| 2006/0123318 | A1* | 6/2006 | Kim | H03M 13/1114 714/758 |
| 2006/0156179 | A1 | 7/2006 | Shen et al. | |
| 2008/0148133 | A1 | 6/2008 | Duggan | |
| 2008/0276156 | A1* | 11/2008 | Gunnam | H03M 13/1177 714/801 |
| 2009/0019333 | A1* | 1/2009 | McEvoy | H03M 13/033 714/752 |
| 2009/0052513 | A1 | 2/2009 | Heikkila | |
| 2009/0106621 | A1* | 4/2009 | Yokokawa | H03M 13/1111 714/752 |
| 2010/0042891 | A1* | 2/2010 | Gunnam | H03M 13/1111 714/752 |
| 2010/0042898 | A1* | 2/2010 | Gunnam | H03M 13/1111 714/755 |
| 2010/0042903 | A1* | 2/2010 | Gunnam | H03M 13/1111 714/780 |
| 2010/0042906 | A1 | 2/2010 | Gunnam et al. | |
| 2010/0169734 | A1 | 7/2010 | Gamage et al. | |
| 2010/0241921 | A1* | 9/2010 | Gunnam | H03M 13/1111 714/752 |
| 2011/0029756 | A1* | 2/2011 | Biscondi | H03M 13/1114 712/22 |
| 2011/0087933 | A1 | 4/2011 | Varnica et al. | |
| 2011/0126078 | A1* | 5/2011 | Ueng | H03M 13/1111 714/755 |
| 2011/0138248 | A1* | 6/2011 | Wu | H03M 13/1137 714/752 |
| 2011/0264979 | A1* | 10/2011 | Gunnam | H03M 13/1128 714/752 |
| 2012/0005551 | A1* | 1/2012 | Gunnam | H03M 13/1108 714/752 |
| 2013/0007554 | A1 | 1/2013 | Chen et al. | |

OTHER PUBLICATIONS

Johnson, L. "Low Density Parity-Check Codes from Combinatorial Designs," PhD Dissertation, The University of Newcastle, Australia, Apr. 2004, two hundred twenty-three pages. [Online] [Retrieved on Jul. 10, 2012] Retrieved from the Internet<URL:http://www.google.com/url?sa=t&rct=j&q=&esrc=s&source=web-&cd=1&ved=0CE8QFjAA&url=http%3A%2F%2Fciteseerx.ist.psu.edu%2Fviewdoc%2Fdownload%3Fdoi%3D10.1.1.17-8.8533%26rep%3Drep1%26type%3Dpdf&ei=Gbj9T9KXL8iw6QHQx8DnBg&usg=AFQjCNFBGPY-A-j4q_LsdiGsISBIhEyldMQ>.

Morero, D.A. et al., "Parallel Architecture for Decoding LDPC Codes on High Speed Communication Systems," EAMTA 2008, Proceedings of the Argentine School of Micro-Nanoelectronics, Technology and Applications, Sep. 2008, pp. 107-110.

Muller, et al., "A Novel LDPC Decoder for DVB-S2 IP," EDAA, 2009, six pages. [Online] [Retrieved on Jul. 10, 2012] Retrieved from the Internet<URL:http://www.date-conference.com/proceedings/PAPERS/2009DAT-E09/PDFFILES/10.3_3.PDF>.

PCT International Search Report and Written Opinion, PCT Application No. PCT/US2012/026819, dated Jul. 25, 2012, eleven pages.

Song, S. et al., "A Unified Approach to the Construction of Binary and Nonbinary Quasi-Cyclic LDPC Codes Based on Finite Fields," IEEE Transactions on Communications, Jan. 2009, pp. 84-93, vol. 57, No. 1.

Liu, L. et al., "Sliced Message Passing: High Throughput Overlapped Decoding of High-Rate Low-Density Parity-Check Codes," IEEE Transactions on Circuits and Systems-I:Regular Papers, Dec. 2008, pp. 3697-3710, vol. 55, No. 11.

United States Office Action, U.S. Appl. No. 13/406,452, dated Feb. 14, 2014, 18 pages.

United States Office Action, U.S. Appl. No. 14/561,183, dated Apr. 21, 2016, 41 pages.

* cited by examiner $$H = \begin{bmatrix} 1 & 1 & 0 & 1 & 0 & 0 & 0 & 0 & 0 & 0 & 1 & 0 \\ 0 & 1 & 1 & 0 & 1 & 0 & 0 & 0 & 0 & 0 & 0 & 1 \\ 1 & 0 & 1 & 0 & 0 & 1 & 0 & 0 & 0 & 1 & 0 & 0 \\ 0 & 1 & 0 & 0 & 1 & 0 & 1 & 0 & 0 & 0 & 0 & 1 \\ 0 & 0 & 1 & 0 & 0 & 1 & 0 & 1 & 0 & 1 & 0 & 0 \\ 1 & 0 & 0 & 1 & 0 & 0 & 0 & 0 & 1 & 0 & 1 & 0 \\ 0 & 0 & 0 & 1 & 0 & 0 & 1 & 0 & 1 & 1 & 0 & 0 \\ 0 & 0 & 0 & 0 & 1 & 0 & 1 & 1 & 0 & 0 & 1 & 0 \\ 0 & 0 & 0 & 0 & 0 & 1 & 0 & 1 & 1 & 0 & 0 & 1 \end{bmatrix}$$

$$H_g = \begin{bmatrix} 1 & 1 & 0 & 1 & 0 & 0 & 0 & 0 & 0 & 0 & 1 & 0 \\ 0 & 1 & 0 & 0 & 1 & 0 & 1 & 0 & 0 & 0 & 0 & 1 \\ 0 & 0 & 0 & 1 & 0 & 0 & 1 & 0 & 1 & 1 & 0 & 0 \end{bmatrix}$$

$$H_i = \begin{bmatrix} \{0,1\} & \{0\} & \{\} & \{1\} \\ \{1\} & \{1\} & \{0\} & \{2\} \\ \{\} & \{0\} & \{0,2\} & \{0\} \end{bmatrix}$$

$$H_i^T = \begin{bmatrix} \{0, 229\} & \{236, 1584\} \\ \{0, 764\} & \{971, 1613\} \\ \{0, 1462\} & \{402, 727\} \\ \{0, 1443\} & \{1464, 1721\} \\ \{0, 83\} & \{892, 1862\} \\ \{0, 1203\} & \{915, 1258\} \\ \{0, 1921\} & \{970, 1340\} \\ \{0, 1686\} & \{1152, 1931\} \\ \{0, 1841\} & \{819, 1190\} \\ \{0, 642\} & \{625, 1466\} \\ \{0, 1779\} & \{0, 372\} \\ \{0, 1195\} & \{511, 580\} \end{bmatrix}$$

FIG. 7A $$H_i^T = \begin{bmatrix} \{0, 272\} & \{1813, 506\} \\ \{0, 242\} & \{1222, 1598\} \\ \{0, 154\} & \{585, 947\} \\ \{0, 669\} & \{1646, 92\} \\ \{0, 558\} & \{966, 1085\} \\ \{0, 285\} & \{1322, 1904\} \\ \{0, 644\} & \{535, 1894\} \\ \{0, 1714\} & \{198, 1782\} \\ \{0, 1887\} & \{1615, 2042\} \\ \{0, 20\} & \{358, 834\} \\ \{0, 176\} & \{951, 1682\} \\ \{0, 479\} & \{84, 557\} \end{bmatrix}$$

FIG. 7B $$H_i^T = \begin{bmatrix} \{0, 102\} & \{904, 1632\} \\ \{0, 764\} & \{577, 1629\} \\ \{0, 1599\} & \{456, 810\} \\ \{0, 1344\} & \{305, 609\} \\ \{0, 1749\} & \{1073, 1938\} \\ \{0, 869\} & \{1099, 1582\} \\ \{0, 359\} & \{570, 1483\} \\ \{0, 784\} & \{595, 652\} \\ \{0, 1458\} & \{195, 1789\} \\ \{0, 1157\} & \{806, 1546\} \\ \{0, 813\} & \{427, 944\} \\ \{0, 1641\} & \{1528, 1869\} \\ \{0, 1716\} & \{696, 1397\} \end{bmatrix}$$

FIG. 7C $$H_i^T = \begin{bmatrix} \{0, 385\} & \{828, 1667\} \\ \{0, 751\} & \{1638, 1791\} \\ \{0, 37\} & \{108, 698\} \\ \{0, 93\} & \{288, 1307\} \\ \{0, 749\} & \{189, 966\} \\ \{0, 1491\} & \{119, 700\} \\ \{0, 1572\} & \{1273, 1977\} \\ \{0, 323\} & \{1773, 1859\} \\ \{0, 473\} & \{1661, 1845\} \\ \{0, 617\} & \{74, 1178\} \\ \{0, 998\} & \{41, 1314\} \\ \{0, 1311\} & \{430, 593\} \\ \{0, 219\} & \{391, 937\} \\ \{0, 319\} & \{140, 1645\} \end{bmatrix}$$

FIG. 7D

NON-CONCATENATED FEC CODES FOR ULTRA-HIGH SPEED OPTICAL TRANSPORT NETWORKS

RELATED APPLICATIONS

This application is a continuation-in-part of U.S. patent application Ser. No. 14/561,183 entitled "Non-Concatenated FEC Codes for Ultra-High Speed Optical Transport Networks" to Damian Alfonso Morero, et al. filed on Dec. 4, 2014, which is a divisional of U.S. patent application Ser. No. 13/406,452 entitled "Non-Concatenated FEC Codes for Ultra-High Speed Optical Transport Networks" to Damian Alfonso Morero, et al. filed on Feb. 27, 2012 which claims priority under 35 U.S.C. § 119(e) to U.S. Provisional Patent Application Ser. No. 61/447,620 entitled "Non-Concatenated FEC Codes for Ultra-High Speed Optical Transport Networks," filed Feb. 28, 2011 by Damian Morero, et al. This application also claims the benefit of U.S. Provisional Patent Application No. 62/107,171 entitled "Non-Concatenated FEC Codes for Ultra-High Speed Optical Transport Networks," filed on Jan. 23, 2015. The contents of each of the above-referenced applications are incorporated by reference herein.

BACKGROUND

1. Field of the Art

The disclosure relates generally to communication systems, and more specifically, to forward error correction codes.

2. Description of the Related Art

Error correction is important component of applications such as optical transport networks and magnetic recording devices. For example, in the next generation of coherent optical communication systems, powerful forward error correction (FEC) codes are desirable to achieve high net effective coding gain (NECG) (e.g., ≥10 dB at a bit error rate (BER) of $10^{-15}$). Given their performance and suitability for parallel processing, large block size low density parity check (LDPC) codes are a promising solution for ultra-high speed optical fiber communication systems. Because of the large block size to achieve high NECG, the use of low complexity soft decoding techniques such as the min-sum algorithm (MSA) is often used when aiming at an efficient very large scale integration (VLSI) implementation. The main stumbling block for the application of this coding approach has been the fact that traditional LDPC codes suffer from BER error floors that are undesirably high.

The error floor is a phenomenon encountered in traditional implementations of iterated sparse graph-based error correcting codes like LDPC codes and Turbo Codes (TC). When the bit error ratio (BER) curve is plotted for conventional codes like Reed Solomon codes under algebraic decoding or for convolutional codes under Viterbi decoding, the curve steadily decreases as the Signal to Noise Ratio (SNR) condition becomes better. For LDPC codes and TC, however, there is a point after which the curve does not fall as quickly as before. In other words, there is a region in which performance flattens. This region is called the error floor region.

To reduce these error floors, some decoders concatenate an LDPC code with a hard-decision-based block code. However, this approach increases the overhead and reduces the performance and the spectral efficiency.

SUMMARY

A decoder decodes forward error correcting codewords using a parity check matrix comprising a plurality of sub-matrices. The decoder comprises a plurality of check node processing units, a plurality of variable processing units, and an output circuit. The plurality of check node processing units each receive a forward error correction codeword, and perform, in parallel, a check node computation corresponding to a different row of the parity check matrix to generate a plurality of check node output messages. The plurality of variable node processing units each receive the plurality of check node output messages and perform a variable node update computations corresponding to different columns belonging to a same sub-matrix of the parity check matrix to generate variable node output messages. The output circuit generates a decoded codeword based on the variable node output messages.

In one embodiment, each of the forward error correcting codewords has a length comprising an integer multiple of a power of 2, and the decoder outputs a decoded codeword having an effective code dimension of a second integer multiple of the power of 2. Furthermore, in one embodiment, the decoder discards a plurality of symbols of the decoded codeword to reduce a code-dimension from a padded code dimension to the effective code dimension.

In one embodiment, each of the forward error correcting codewords has a code-length of 24576 symbols, a padded code dimension of 20482 symbols, and an effective code dimension of 20480.

In another embodiment, each of the forward error correcting codewords has a code-length of 26624 symbols, a padded code dimension of 22530 symbols, and an effective code dimension of 22528.

In yet another embodiment, each of the forward error correcting codewords has a code-length of 28672 symbols, a padded code dimension of 24578 symbols, and an effective code dimension of 24576.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 5 is an example embodiment of various notations for a parity check matrix for forward error correction.

FIG. 6 is an example embodiment of a parity check matrix for forward error correction.

FIG. 7A is a first example embodiment of a parity check matrix for forward error correction using a short notation.

FIG. 7B is a second example embodiment of a parity check matrix for forward error correction using a short notation.

FIG. 7C is a third example embodiment of a parity check matrix for forward error correction using a short notation.

FIG. 7D is a fourth example embodiment of a parity check matrix for forward error correction using a short notation.

DETAILED DESCRIPTION

Overview

A system operates using non-concatenated forward error correction (FEC) codes suitable for applications such as 100 Gb/s optical transport networks (OTN) or magnetic recording (MR) apparatuses. The system operates using a high-gain, very low error floor, long LDPC-only based code suitable for ultra-high speed fiber optical communication systems. The described system can, in some embodiments, achieve a net effective coding gain (NECG)>10 dB or better at a bit error rate (BER) of $10^{-15}$ with an overhead (OH) of ~20% or better (e.g., 18.18% or 16.66%). Relative to prior systems that use concatenated codes, the non-concatenated codes described herein achieve superior performance, lower latency, and lower overhead than the concatenated codes.

To overcome potential performance issues due to BER floors, a low density parity check (LDPC) code is described. Semi-analytic techniques are combined with a study of dominant error events in order to determine a parity check matrix having high performance characteristics. A post-processing method is also described (e.g., an adaptive quantization (AQ) post-processing method) that can effectively eliminate the BER floors once they are pushed to sufficiently low levels in the parity check matrix design. An implementation of a decoder is also described for use with the LDPC codes and post-processing method.

The LDPC code and the hardware architecture of the decoder are jointly designed in order to (i) minimize (or sufficiently lower) the error floor and (ii) reduce the amount of memory and interconnection complexity. For example, in one embodiment, a (24576, 20482) (i.e., 20% OH) QC-LDPC-only code with a 5-bit MSA decoder is used for 100 Gb/s optical systems. In another embodiment, a (26624, 22530) (i.e., 18.18% OH) QC-LDPC-only code with a 5-bit MSA decoder is used. In yet another embodiment, a (28672, 24578) (i.e., 16.66% OH) QC-LDPC-only code with a 5-bit MSA decoder is used.

System Architecture

Figure 1:
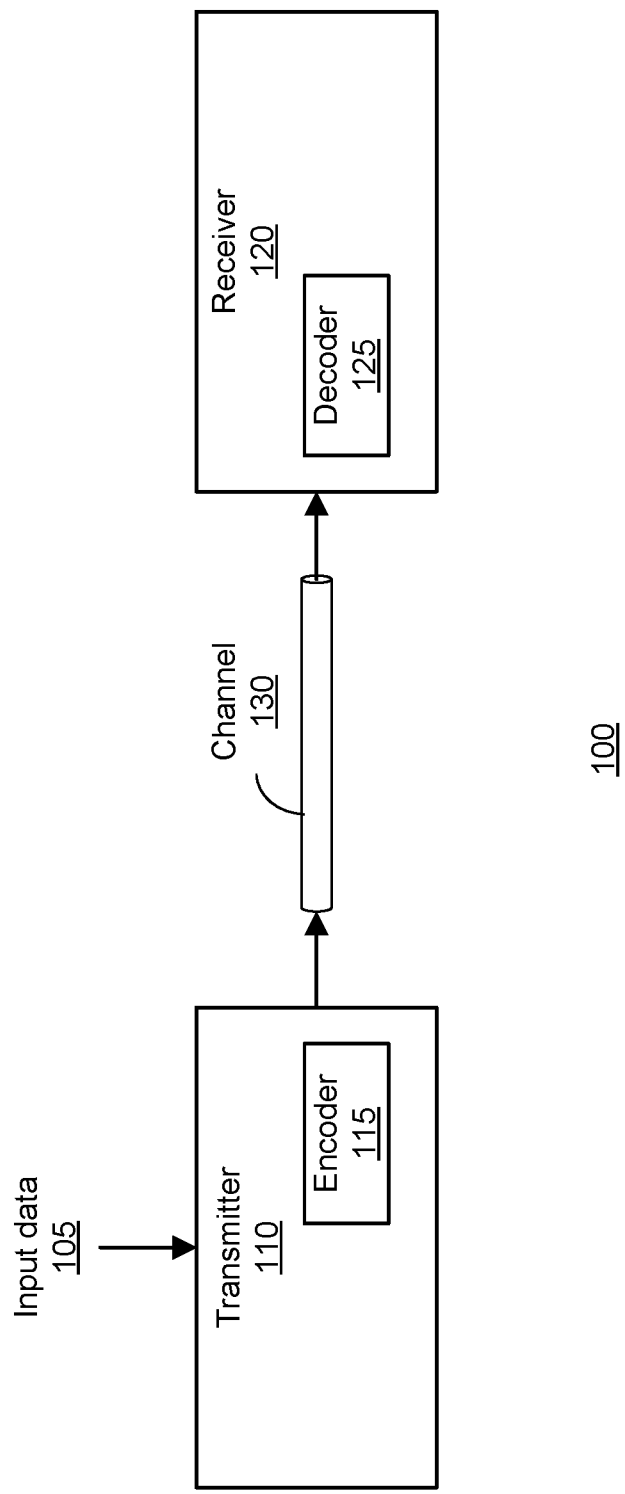
FIG. 1 is a high level block diagram of an embodiment of a communication system.

FIG. 1 is a block diagram of a communication system 100. The communication system 100 comprises a transmitter 110 for transmitting data to a receiver 120 via a communication channel 130. The transmitter 110, receiver 120, and communication channel 130 may be of various types, depending on the end application for the communications system 100. For example, in one embodiment, the communication system 100 comprises an ultra-high speed (e.g., 100 Gb/s or faster) optical fiber communication system. In alternative embodiments, the communication system 100 may comprise, for example, a microwave, radio frequency (RF), cable, or other type of communication system.

The communication channel 130 may be unreliable or noisy. Thus, the data received by the receiver 120 often contains errors (e.g., bit flips) relative to the transmitted data. The transmitter 110 and receiver 120 therefore utilize an error correction technique that enables the receiver 120 to detect, and in many cases, correct errors in the data received over the channel 130 from the transmitter 110.

The transmitter 110 receives input data 105 for transmission to the receiver 120 via the communication channel 130. The transmitter 110 includes an encoder 115 that encodes the data using forward error-correcting (FEC) codes. In one embodiment, a block coding scheme is used in which each block of binary input data is mapped to an FEC codeword. Generally, the FEC code provides some redundancy in the data by incorporating extra data symbols. For example, in one embodiment, the encoder applies a transform function to an input data block having k symbols to generate an FEC code having n symbols, where n>k. This redundancy allows the receiver 120 to detect a limited number of errors that may occur in the transmitted data and in many cases to correct such errors. More specific details about the FEC codes are provided below.

In addition to the encoder 115, the transmitter 110 may comprise other conventional features of a transmitter 110 which are omitted from FIG. 1 for clarity of description. For example, the transmitter may include components such as a modulator, a serial or parallel/serial converter, a driver or amplifier circuit, a laser source, etc.

The receiver 120 receives the data encoded as FEC codes from the transmitter 110 via the communication channel 120. The receiver 120 includes a decoder 125 that decodes the FEC codes data to attempt to recover the original data blocks. For example, in one embodiment, the decoder 125 applies a parity check matrix H to a received FEC codeword having n symbols to recover a data block having k symbols where n>k. More specific details on the decoding technique is provided below.

In addition to the decoder 125, the receiver 120 may comprise other conventional features of a receiver 120 which are omitted from FIG. 1 for clarity of description. For example, the receiver 120 may include components such as a demodulator, an analog-digital converter, amplifier circuits, timing recovery circuits, an equalizer, various filters, etc.

Components of the transmitter 110 and the receiver 120 described herein may be implemented, for example, as an integrated circuit (e.g., an Application-Specific Integrated Circuit (ASIC) or using a field-programmable gate array (FPGA), in software (e.g., loading program instructions to a processor from a computer-readable storage medium and executing the instructions by the processor), or by a combination of hardware and software.

Figure 2:
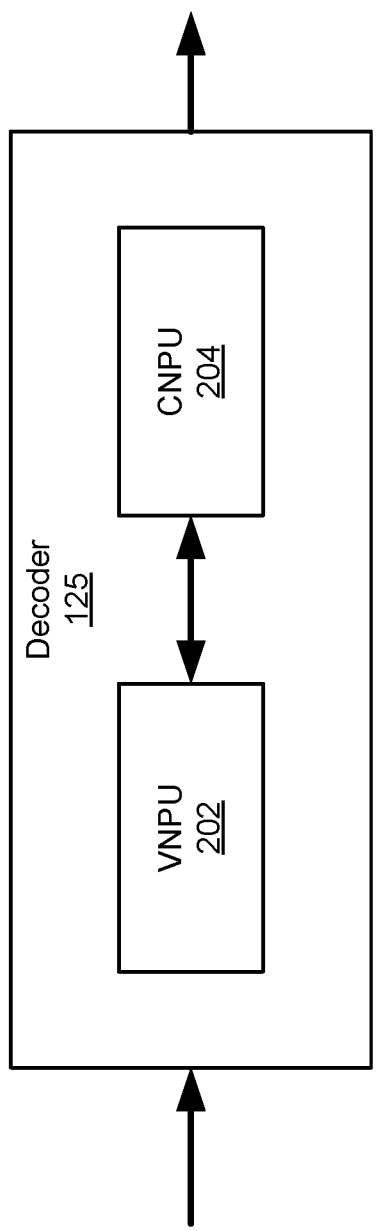
FIG. 2 is a high level block diagram of an embodiment of a decoder.

FIG. 2 illustrates an example embodiment of a decoder 125. In this embodiment, the decoder 125 iteratively decodes the received codewords using a decoding algorithm such as, for example, the sum-product algorithm (SPA), the min-sum algorithm (MSA), or the scaled min-sum algorithm (SMSA). In one embodiment, the decoder 125 comprises a variable-node processing unit (VNPU) 202, and a check-node processing unit (CNPU) 204. The VNPU 202, and/or CNPU 204 may each comprise a plurality of parallel processing units (e.g., q processing units). This allows for an efficient parallel decoding process as will be described in further detail below. More specific examples of architectures for the decoder 125 are described in FIGS. 9-11.

General LDPC Codes

In one embodiment, the communications system 100 uses low density parity check (LDPC) codes for forward error correction. An LDPC code is a linear block code defined as the null space of a sparse (m×n) parity check matrix H, where n represents the number of bits in the block and m denotes the number of parity checks. The matrix H is considered "sparse" because the number of 1s is small compared with the number of 0s. Using the above definition, the set of LDPC codes $\mathbb{C}$ is defined as:

$$\mathbb{C} = \{c : Hc = 0\} \quad (1)$$

where c is an LDPC codeword in the set $\mathbb{C}$. Note that each row of H provides a parity check on the codewords. Particularly, each row indicates that a linear combination of certain bits (specified by the 1s in the row) will add to zero for a valid codeword. Furthermore, an invalid codeword can often be corrected by comparing results of multiple parity checks and determining a most likely location of the error(s).

Figure 3:
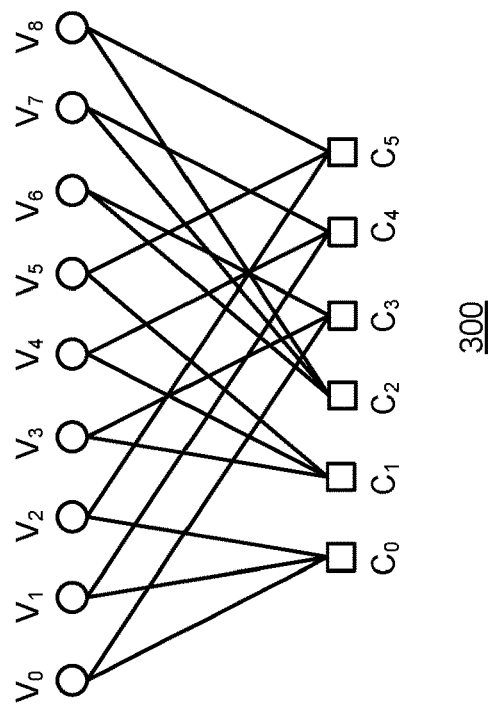
FIG. 3 is an example embodiment of a parity check matrix and Tanner graph for forward error correction.

Matrix H can be graphically represented using a Tanner graph 300 as illustrated in FIG. 3 for an example matrix H. The Tanner graph 300 is a bipartite graph composed of two types of nodes: (1) variable or bit nodes $v_i$ which represent the columns of H; and (2) the check nodes $c_j$ which represent the rows of H. A connection between nodes $v_i$ and $c_j$ exists in the Tanner graph 300 if and only if $H_{j,i}=1$. Note that there are not connections between two check nodes or between two bit nodes.

LDPC codes can be classified as "regular" or "irregular" based on characteristics of the matrix H. A matrix H is regular if it is both row-regular and column-regular. Otherwise, the matrix H is irregular. Matrix H is row-regular if $\rho_i = \rho$ for all i where $\rho_i$ is the number of 1s in the $i^{th}$ row of H. In other words, the matrix H is row-regular if all rows have the same number of 1s. Similarly, Matrix H is column-regular if $\gamma_i = \gamma$ for all i where $\gamma_i$ is the number of 1s in the $i^{th}$ column of H. In other words, the matrix H is column-regular if all columns have the same number of 1s.

For a given variable node $v_i$ or check node $c_j$, the number of connections to it determines its degree. If all $v_i$ nodes have the same degree $\gamma$ and all $c_j$ nodes the same degree $\rho$, then the LDPC code is said to be a $(\gamma, \rho)$-regular LDPC.

Figure 4:
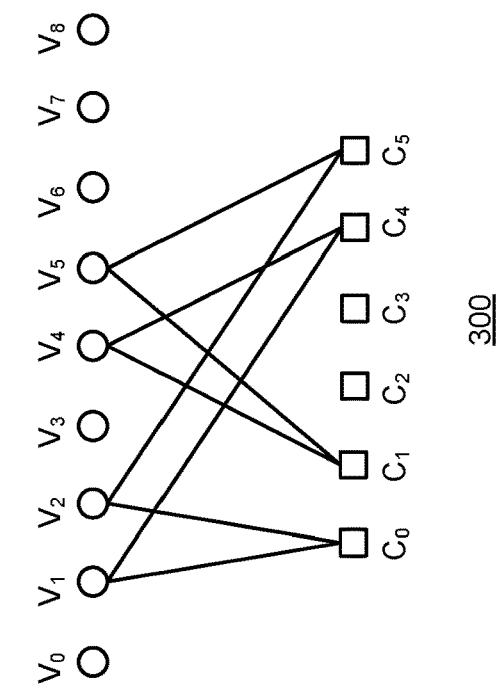
FIG. 4 is an example embodiment of a cycle of a parity check matrix and Tanner graph for forward error correction.

A "cycle" in the Tanner graph 300 for a matrix H is a closed sequence (e.g., a loop) of connected nodes. FIG. 4 illustrates an example of a cycle having a length 8. As can be seen, the series of connections forms a closed loop with a total of 8 links. Note that a Tanner graph for a matrix H may have multiple cycles. The "girth" of the Tanner graph for a matrix H is the length of the shortest cycle.

Quasi-Cyclic LDPC Codes

A cyclic matrix or "circulant" is a square matrix in which each row is the cyclic shift of the row above it (i.e., the symbols in the row are right-shifted by one relative to the row immediately above it with the last symbol in the row shifted to the first position), and the first row is the cyclic shift of the last row. Furthermore, each column is the downward cyclic shift of the column on its left (i.e., the symbols in the column are down-shifted by one relative to the column immediate to the left of it, with the last symbol in the column shifted to the first position), and the first column is the cyclic shift of the last column.

A characteristic of a circulant is that the row and column weights w are the same, where the weight w of a row or column represents the number of 1s in the row or column. Note that due to the characteristics of the circulant, the row and column weights also give the number of non-zero diagonals in the matrix. The weights w of the rows and columns of the circulant can also generally be referred to as the weight of the circulant. Note that if w=1, then the circulant is a permutation matrix, referred to as a circulant permutation matrix.

Another characteristic of a circulant is that the circulant can be completely characterized by its first row (or first column). In other words, if the first row (or column) of the matrix is known, the rest of the matrix can be generated by applying appropriate shifts to this vector based on the characteristics of the circulant defined above. Therefore, the first row (or column) is referred to herein as the "generator of the circulant."

In quasi-cyclic LDPC codes, the parity check matrix H is an array of sparse square circulant matrices of the same size. Observing that the LDPC code is given by the null-space of H, a set of quasi-cyclic LDPC codes can be defined by the null space of an array of sparse square circulant matrices of the same size. Quasi-cyclic codes represent a generalization of cyclic codes whereby a cyclic shift of a codeword by p positions results in another codeword. Therefore, cyclic codes are simply QC codes with p=1. QC-LDPC codes can beneficially perform very close to the Shannon limit and their cyclic properties reduce the implementation complexity, and allow the use of efficient algebraic techniques to compute the code parameters and optimize the performance.

An example of a parity check matrix H for QC-LDPC codes is illustrated in FIG. 5 according to various notations. In this example, matrix H is a 3×4 array of 3×3 circulants having varying weights of 0, 1, and 2. As explained above, the circulants are completely defined by the generator (first row) of each circulant. Therefore, the same matrix H can be represented in a short notation given by $H_g$ based on the generator. An even more compact notation for representing the matrix H is shown in matrix $H_i$. In this notation, each circulant is represented by a vector defining the non-zero column positions of the generator of each circulant. As can be seen, the compact notation in $H_i$ completely defines the matrix H.

Regular Column Partition (RCP) QC-LDPC Codes

A regular column partition QC-LDPC (RCP-QC-LDPC) code is an LDPC code that meets both the column-regular constraint and the quasi-cyclic constraint described above. Let H be the (m×n) parity check matrix of an LDPC code. Assuming that n=μq with μ and q integers, the matrix H can be partitioned into μ (m×q) sub-matrices:

$$H = [H^{(0)} \ldots H^{(r)} \ldots H^{(\mu-1)}]. \quad (2)$$

The parity check matrix H has the characteristic that the weights of the rows and columns of each of the sub-matrices $H^{(r)}$ do not change with r. Thus, each sub-matrix of H is regular and the matrix H itself is regular.

Furthermore, in one embodiment, a type-p RCP-QC-LDPC code is used. In this type of code, each of the circulant sub-matrices $H^{(r)}$ has the same rows weight p (i.e., the number of non-zero diagonals). For VLSI implementation, a small value of p is often desirable since the complexity increases (at least) linearly with p. A high value of p reduces the maximum girth of the code, which increases the error floor probability.

Figure 6:
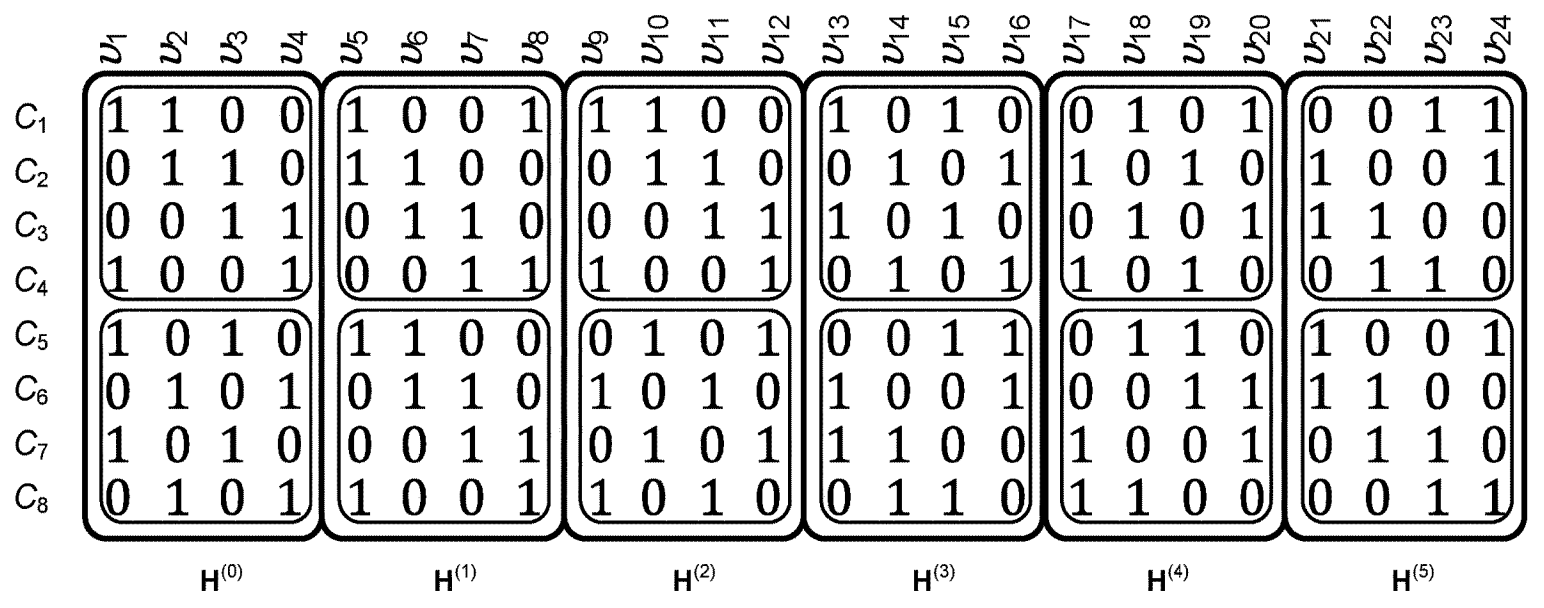

FIG. 6 illustrates an example (4, 12)-regular matrix H that is partitioned into $\mu=6$ (4, 2)-regular sub-matrices ($H^{(1)}$ . . . $H^{(6)}$), where q=4. While the example in FIG. 6 is illustrative of the properties of a general parity check matrix for an for RCP-QC-LDPC codes, a parity check matrix H may in practice be composed of significantly larger sub-matrices $H^{(r)}$ and may have a larger number of sub-matrices (higher value of $\mu$). For example, in one embodiment, a parity check matrix H for RCP-QC-LDPC codes comprises a 2×12 array of circulants each having a size 2048×2048 and a weight of 2. Thus, in this embodiment, the parity check matrix H is configured for type-2 RCP-QC-LDPC codes and has a column weight of 4. In one embodiment, the maximum girth of the parity check matrix H is eight. In other embodiments, the parity check matrix H for RCP-QC-LDPC codes comprises, for example, a 2×13 or 2×14 array of circulants.

FIG. 7A illustrates an example of a transposed version of $H_i$ representing the compact notation for matrix H corresponding to a first example set of codes $C_1$. This first code set, $C_1$, is designed to avoid cycles of length 4. FIG. 7B illustrates an example of a transposed version of $H_i$ representing the compact notation for matrix H corresponding to a second example set of codes $C_2$. This second code set, $C_2$, is designed to (i) avoid cycles of having length ≤6 (i.e. it achieves the maximum girth) and (ii) minimize number of cycles of length 8. A parity check matrix H having the characteristics described above will result in a code length of 24576 symbols (e.g., bits) and a code dimension k=n−rank(H)=20,482 symbols where k is the size of a decoded codeword. In one embodiment, in order to simplify the implementation of the architecture described in more detail below, only 20480 symbols are used to encode the data. This effective code dimension of 20480 symbols is padded by two additional symbols set to a default value (e.g., 0 or 1), thus providing a padded code dimension of 20482 symbols. In this embodiment, the encoder is designed in a way that the two unused symbols are not systematic (i.e., they are not directly mapped to the output codeword). Therefore, they can be set to 0 or 1 without affecting the randomness of the decoder output. Beneficially, the effective code dimension seen by the decoder is 10*2048 symbols, which enables a parallelism factor in the decoder that is a power of 2. The expansion ratio is given by $$ExpansionRatio = \frac{24756}{20482-2} = \frac{12}{10}.$$

In one embodiment, the RCP-QC-LDPC codes having the characteristics above is able to achieve a net effective coding gain (NECG) of 10 dB or higher (e.g., 11.3 dB) at a bit error rate (BER) of $10^{-15}$ with 13 iterations of a scaled Min-Sum algorithm (described below) and an input resolution of 5 bits in the decoder. Furthermore, the RCP-QC-LDPC codes have an overhead of about 20%.

FIG. 7C illustrates an example of a transposed version of $H_i$ representing the compact notation for matrix H corresponding to a third example set of codes $C_3$. In one embodiment, the parity check matrix H of FIG. 7C comprises a 2×13 array of circulants each having a size 2048×2048 and a weight of 2. This third code set, $C_3$, is designed to (i) avoid cycles having length ≤6 and (ii) minimize the number of cycles of length 8. A parity check matrix H having the characteristics described above will result in a code length of 26624 symbols (e.g., bits) and a code dimension k=n−rank(H)=22530 symbols where k is the size of a decoded codeword. In one embodiment, in order to simplify the implementation of the architecture, the 22530 symbols represents a padded code dimension in which two of the symbols are not used to encode the data and are instead set to a default value (e.g., 0 or 1) resulting in an effective code dimension of 22528 symbols used to encode the data. The unused symbols are not systematic. Beneficially, the effective code dimension seen by the decoder in this embodiment is 11*2048 symbols, which enables a parallelism factor in the decoder that is a power of 2.

The expansion ratio is given by $$ExpansionRatio = \frac{26624}{22530-2} = \frac{13}{11}.$$

In one embodiment, the RCP-QC-LDPC codes having the characteristics above is able to achieve a net effective coding gain (NECG) of 11.2 dB or higher at a bit error rate (BER) of 1e-15 with 13 iterations of a scaled Min-Sum algorithm (described below) and an input resolution of 5 bits in the decoder. Furthermore, the RCP-QC-LDPC codes have an overhead of about 18.18%.

FIG. 7D illustrates an example of a transposed version of $H_i$ representing the compact notation for matrix H corresponding to a fourth example set of codes $C_4$. In one embodiment, the parity check matrix H of FIG. 7D comprises a 2×14 array of circulants each having a size 2048×2048 and a weight of 2. This fourth code set, $C_4$, is designed to (i) avoid cycles having length ≤6 and (ii) minimize the number of cycles of length 8. A parity check matrix H having the characteristics described above will result in a code length of 28672 symbols (e.g., bits) and a code dimension k=n−rank(H)=24578 symbols where k is the size of a decoded codeword.

In one embodiment, in order to simplify the implementation of the architecture, the 24578 symbols represents a padded code dimension in which two of the symbols are not used to encode the data and are instead set to a default value (e.g., 0 or 1) resulting in an effective code dimension of 24576 symbols used to encode the data. The unused symbols are not systematic. Beneficially, the effective code dimension seen by the decoder in this embodiment is 12*2048 symbols, which enables a parallelism factor in the decoder that is a power of 2.

The expansion ratio is given by $$ExpansionRatio = \frac{28672}{24578-2} = \frac{14}{12}.$$

In one embodiment, the RCP-QC-LDPC codes having the characteristics above is able to achieve a net effective coding gain (NECG) of 11.1 dB or higher at a bit error rate (BER) of 1e-15 with 13 iterations of a scaled Min-Sum algorithm (described below) and an input resolution of 5 bits in the decoder. Furthermore, the RCP-QC-LDPC codes have an overhead of about 16.66%.

As can be seen, each of the above described embodiments has a code length that is an integer multiple of a power of 2 and an effective code dimension that is an integer multiple of a power of 2. This simplifies the hardware implementation due to the parallelization factor and also produces simpler throughput expansion ratios.

In one embodiment, a variable-node partition with full check-node connectivity (VPFCC) constraint in also imposed on the parity check matrix H. In this embodiment, all of the sub-matrices $H^{(r)}$ have only a single 1 in each of its rows.

Reducing the Number of Short-Cycles of the Parity Check Matrix

Figure 8:
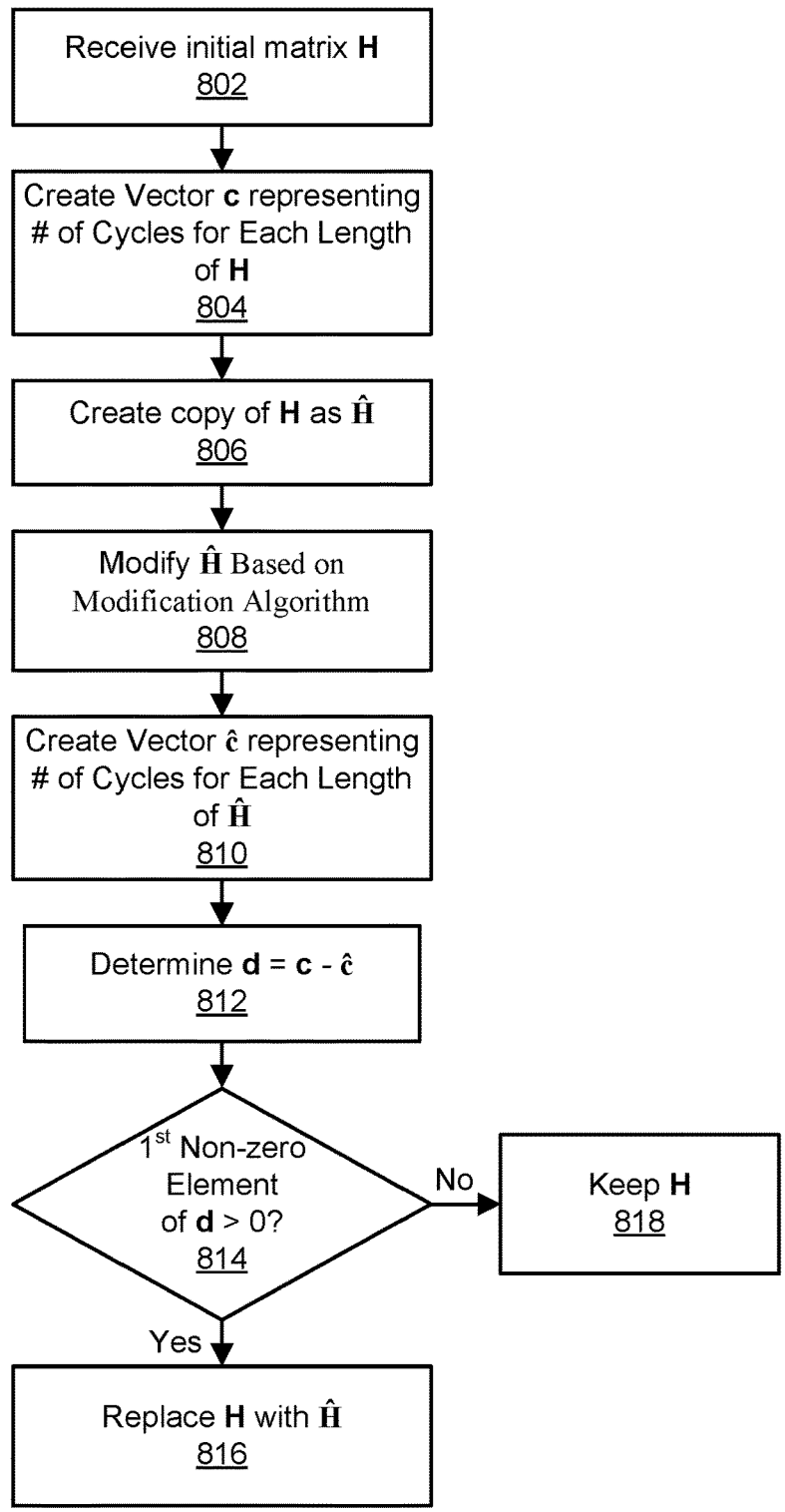
FIG. 8 is an example embodiment of process for determining reducing cycle length in a parity check matrix for forward error correction.

In order to choose a specific parity check matrix H and an associated set of RCP-QC-LDPC codes C, a technique may be used to find a quasi-cyclic parity check matrix having a low number of short-cycles. An example embodiment of a process for reducing the number of short-cycles is illustrated in FIG. 8. The process can begin by receiving 802 an initial parity check matrix H meeting RCP and quasi-cyclic constraints described above. A vector c is created 804 representing the number of cycles of H of different lengths in order of increasing cycle length. For example, the number of cycles of H with lengths 4, 6, 8, . . . and so on are computed to create a histogram with each bin corresponding to a different cycle length. This computation can be implemented in several ways. For example, in one embodiment, a matrix A is denoted as the adjacency matrix of the Tanner Graph of H. It can be shown that the (i,j)-entry of $A^l$ equals the number of paths of length l from node-i to node-j (Theorem 1). Furthermore, it can be shown that in a graph with girth δ, the nodes i and j are directly opposite each other in a δ-loop if and only if $A_{i,j}^{\delta/2} \geq 2$ and $A_{i,j}^{\delta/2-2}=0$ (Theorem 2). Then, because the Tanner Graph of H is bipartite it contains only even-length (δ even) cycles. Therefore, there are δ ordered pairs of opposite nodes in a δ-cycle, i.e. there are δ entries on $A_{i,j}^{\delta/2}$ that verified the constraints above and represent the same cycle. Note also that each non-ordered pair of the $A_{i,j}^{\delta/2}$ paths connecting i and j create a different loop, i.e. there are $\Phi(i,j)=A_{i,j}^{\delta/2}(A_{i,j}^{\delta/2}-1)/2$ different loops that contain nodes i and j as opposed nodes. Therefore, the number N of minimum length cycles is:

$$N = \frac{1}{\delta} \sum_{i,j} I(i,j) \cdot \Phi(i,j) \quad (3)$$

where $I(i,j) \in \{0,1\}$ is the indicator function which takes the value 1 if Theorem 2 is verified for that particular entry of the adjacency matrix or 0 elsewhere. In one embodiment, to speed up the computation of N in Eq. (3), the polynomial representation of H over the ring $Z[x]/(x^L-1)$ may be used. It also possible to modify Eq. (3) in order to increase the penalty of the $\Phi(i,j)$ interconnected cycles. This may be done, for example, by adding an exponential coefficient as $[\Phi(i,j)]^w$ with w>1 or in general by replacing $\Phi(i,j)$ by $f(\Phi(i,j))$ for some non-decreasing function $f(\cdot)$. Since absorbing sets are usually created by the interconnection of several short length cycles, this variation may help to further reduce the probability of an error floor.

A copy of H is then created 806 and denoted Ĥ. Ĥ is then modified 808 according to a modification algorithm while maintaining the same quasi-cyclic constraint. For example, in one embodiment, one of the cyclic sub-matrices of Ĥ is chosen based on a pseudo-random algorithm and the position of one of its diagonals is changed to a different location which is also chosen based on a pseudo-random algorithm. This step 808 may be repeated several times before continuing to the following step. This technique results in a random walk over the parameters of a quasi-cyclic parity check matrix. In alternative embodiments, a different technique could be used to modify Ĥ.

A vector ĉ is then created 810 representing the number of cycles of Ĥ of each length in order of increasing cycle length. For example, the number of cycles of Ĥ with lengths 4, 6, 8, . . . and so on are computed to create a histogram with each bin corresponding to a different cycle length. This computation can performed using a similar algorithm as described above. A vector is computed 812 as d=c−ĉ. If at decision block 814, the first non-zero element in d is positive, then H is replaced 816 with Ĥ. Otherwise, the matrix H is kept 818. Note that the comparison of the number of cycles between c and ĉ occur in increasing order of cycle length. Thus, for example, the cycles of length 4 are compared first; if they are equal the cycles of length 6 are compared and so on. Optionally, if further optimization is desired, the process may return to step 802 and repeat for any number of iterations (e.g., a fixed number of iterations or until a stopping criterion is met).

Iterative Decoding Algorithms

As data blocks are received by the decoder 125, the decoder decodes the data blocks and applies the parity check matrix H to recover the transmitted data. In one embodiment, the decoder 125 may apply, for example, a sum-product algorithm (SPA), a min-sum algorithm (MSA), or a scaled min-sum algorithm (SMSA) to decode the received data blocks.

Let $b_i$ and $x_i$ be the i-th bit of the codeword and the corresponding channel output respectively. The input to the decoder 125 is the prior log-likelihood ratio (LLR) $L_i^a$ defined by:

$$L_i^a = \ln\left(\frac{P_a(b_i = 0 \mid x_i)}{P_a(b_i = 1 \mid x_i)}\right), \quad (4)$$

where $P_a(\cdot)$ denotes the a-priori probability of the bit $b_i$. Thus, $L_i^a$ represents an initial likelihood of the input bit i being a 0 or a 1. Then, an iterative decoding procedure between variable and check nodes is carried out as follows:

$$L_{v_i \to c_j}^e = L_i^a + \sum_{c_k \in C^{(v_i)} \setminus c_j} L_{c_k \to v_i}^e, \quad (5)$$

$$L_{c_j \to v_i}^e = \phi^{-1}\left\{\sum_{v_k \in V^{(c_j)} \setminus v_i} \phi[L_{v_k \to c_j}^e]\right\}, \quad (6)$$

where $C^{(v_i)}=\{c_j:H_{j,i} \neq 0\}$, $V^{(c_j)}=\{v_i:H_{i,j} \neq 0\}$, $\phi(x)=\ln[\tan h(x/2)]$, and $\phi^{-1}(x)=2 \tan h^{-1}(e^x)$. The posterior LLR is computed in each iteration by $$L_i^o = L_i^a + \sum_{c_k \in C^{(v_i)}} L_{c_k \to v_i}^e \quad (7)$$

Hard decisions are derived from (7). The iterative decoding process is carried out until hard decisions satisfy all the parity check equations or when an upper limit on the iteration number is reached.

The decoding algorithm can be understood in view of the Tanner Graph (see e.g., FIG. 3). Here, the algorithm can be represented as the passing messages between the variable nodes and the check nodes of the Tanner Graph as described in the equations above. In the equations (4)-(7), $L_{v_i \to c_j}^e$ is the extrinsic information sent by the variable node T to the check node 'j'. It represents an estimation of the probability of the bit T being a '0' or '1' given the a priori information $L_i^a$ and the information coming from all other check nodes connected to the variable node 'i' except that coming from the check node 'j'. $L_{c_j \to v_i}^e$ is the extrinsic information sent by the check node T to the variable node T. It represents an estimation of the probability of the bit T being a '0' or '1' given the information coming from all the other variable nodes connected to the check node 'j' except that coming from the variable node 'i'.

The computation of (5) and (7) are performed by the VNPU 202 of the decoder 125 and the computation of (6) is performed by the CNPU 204 of the decoder 125. Since the CNPU 204 consumes most of the computational requirements of the above-described decoding algorithm, a simplified expression of (6) may be implemented:

$$\hat{L}_{c_j \to v_i}^e = \min_{v_k \in v^{(c_j) \setminus v_i}} |L_{v_k \to c_j}^e| \cdot \prod_{v_k \in v^{(c_j) \setminus v_i}} \text{sign}(L_{v_k \to c_j}^e). \quad (8)$$

This approach is called the min-sum algorithm (MSA). To reduce the approximation error of (8), another modification can optionally be employed called the scaled min-sum algorithm (SMSA). The check node computation performed by the CNPU 204 in SMSA is given by:

$$\hat{L}_{c_j \to v_i}^e = \alpha \cdot \min_{v_k \in v^{(c_j) \setminus v_i}} |L_{v_k \to c_j}^e| \cdot \prod_{v_k \in v^{(c_j) \setminus v_i}} \text{sign}(L_{v_k \to c_j}^e) \quad (9)$$

with $\alpha$ being a factor smaller than unity (e.g., $\alpha \approx 0.75$).

To further reduce the implementation complexity, computation of Eq. (9) can divided into a series of steps represented by equations (10A) to (10E) which are implemented by the CNPU 204:

$$\hat{L}_{c_j \to v_i}^e = \begin{cases} \alpha \cdot M_{j,i}^{(1)} \cdot S_{j,i} \cdot \text{sign}(L_{v_i \to c_j}^e) & \text{if } v_i \neq v_{j,i}^{(1)} \\ \alpha \cdot M_{j,i}^{(2)} \cdot S_{j,i} \cdot \text{sign}(L_{v_i \to c_j}^e) & \text{if } v_i = v_{j,i}^{(1)} \end{cases} \quad (10A)$$

$$M_{j,i}^{(1)} = \min_{v_k \in v^{(c_j)}} |L_{v_k \to c_j}^e| \quad (10B)$$

$$M_{j,i}^{(2)} = \min_{v_k \in v^{(c_j) \setminus v_{j,i}^{(1)}}} |L_{v_k \to c_j}^e| \quad (10C)$$

$$v_{j,i}^{(1)} = \arg \left\{ \min_{v_k \in v^{(c_j)}} |L_{v_k \to c_j}^e| \right\} \quad (10D)$$

$$S_{j,i} = \prod_{v_k \in v^{(c_j)}} \text{sign}(L_{v_k \to c_j}^e) \quad (10E)$$

Figure 9:
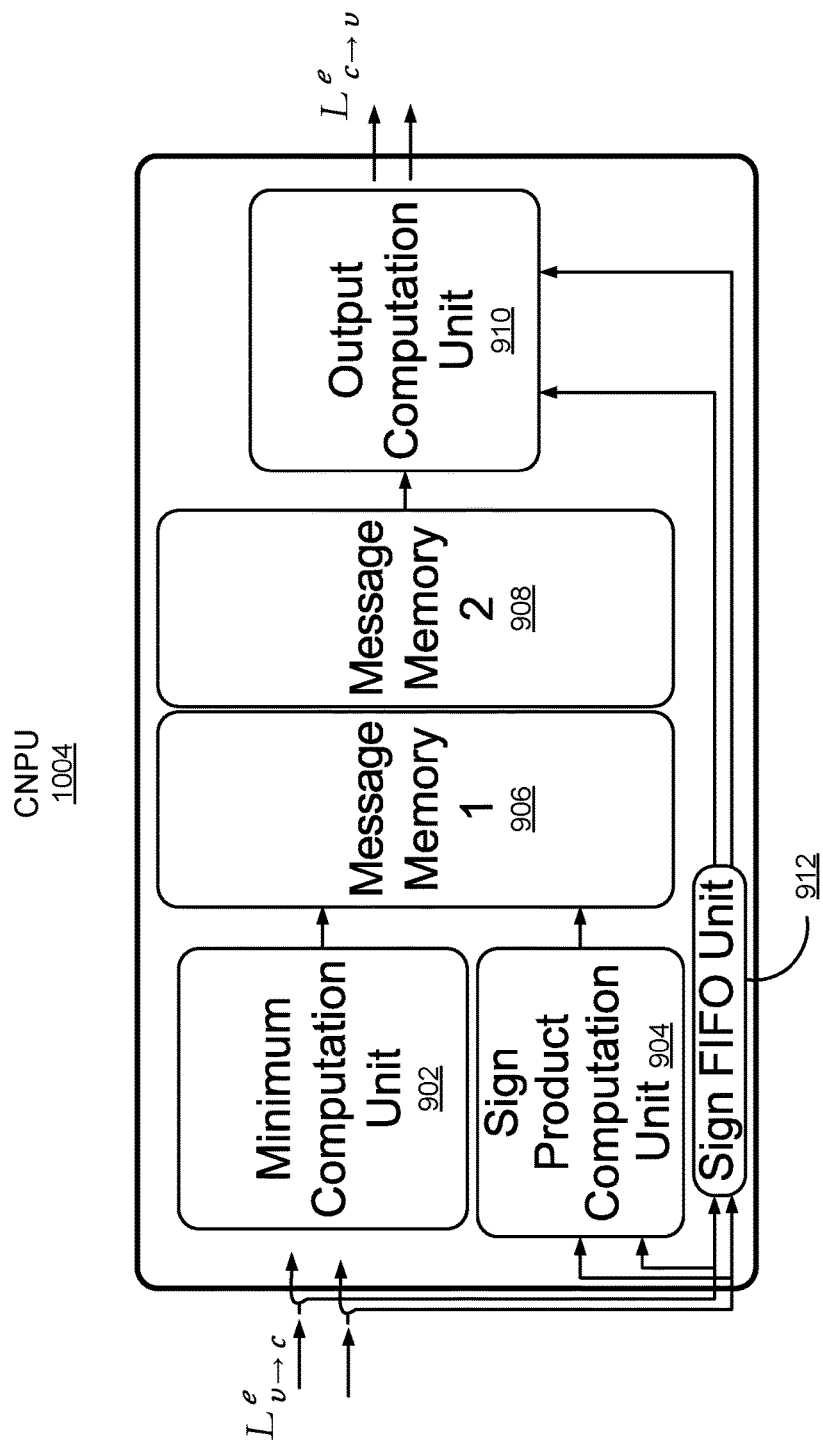
FIG. 9 is an example embodiment of a check node processing unit for decoding LDPC codes.

FIG. 9 illustrates an embodiment of a CNPU 1004 for processing two codewords at the same time according to Eqs. (10A)-(10E) above. In this architecture, Eq. (10A) is computed by the output computation unit 910, Eqs. (10B), (10C), and (10D) are computed by the Minimum Computation unit 902, and Eq. (10E) is computed by the Sign Product Computation Unit 904. The Message Memory 1 906 and Message Memory 2 908 save the results of equations (10B)-(10E) as described below.

The minimum computation unit 902 computes the minimum value (called the first minimum value) of the absolute value of $L_{v \to c}^e$ as indicated in Eq. (10B). The minimum computation unit 902 also determines which variable node corresponds to this minimum value as described in Eq. (10D). Furthermore, the minimum computation unit 902 computes the minimum value (called the second minimum value) of the absolute values $L_{v \to c}^e$ but without taking into account the message coming from the variable node which corresponds to the first minimum value as described in Eq. (10C). In other words, the minimum computation unit 902 determines the two lowest absolute values of the input messages from the set of variable nodes and the variable nodes that these messages came from. The sign product computation unit 904 determines the product of the signs of $L_{v \to c}^e$ as indicated in Eq. (10E) above. The outputs of the minimum computation unit 902 and the sign product computation unit 904 are stored to the pipelined message memory 1 906 and message memory 2 908. A sign FIFO unit 912 stores the signs of the input messages $L_{v \to c}^e$ to be used later by the output computation unit 910. The output computation unit 910 combines the values stored in the sign FIFO unit 912 and the memory message 908 according to Eq. (10A) above and outputs the result $L_{c \to v}^e$. Operation of the CNPU 1004 in conjunction with a parallel decoder implementation is described in further detail below.

Parallel Implementation of Iterative Decoding Algorithm

Figure 10:
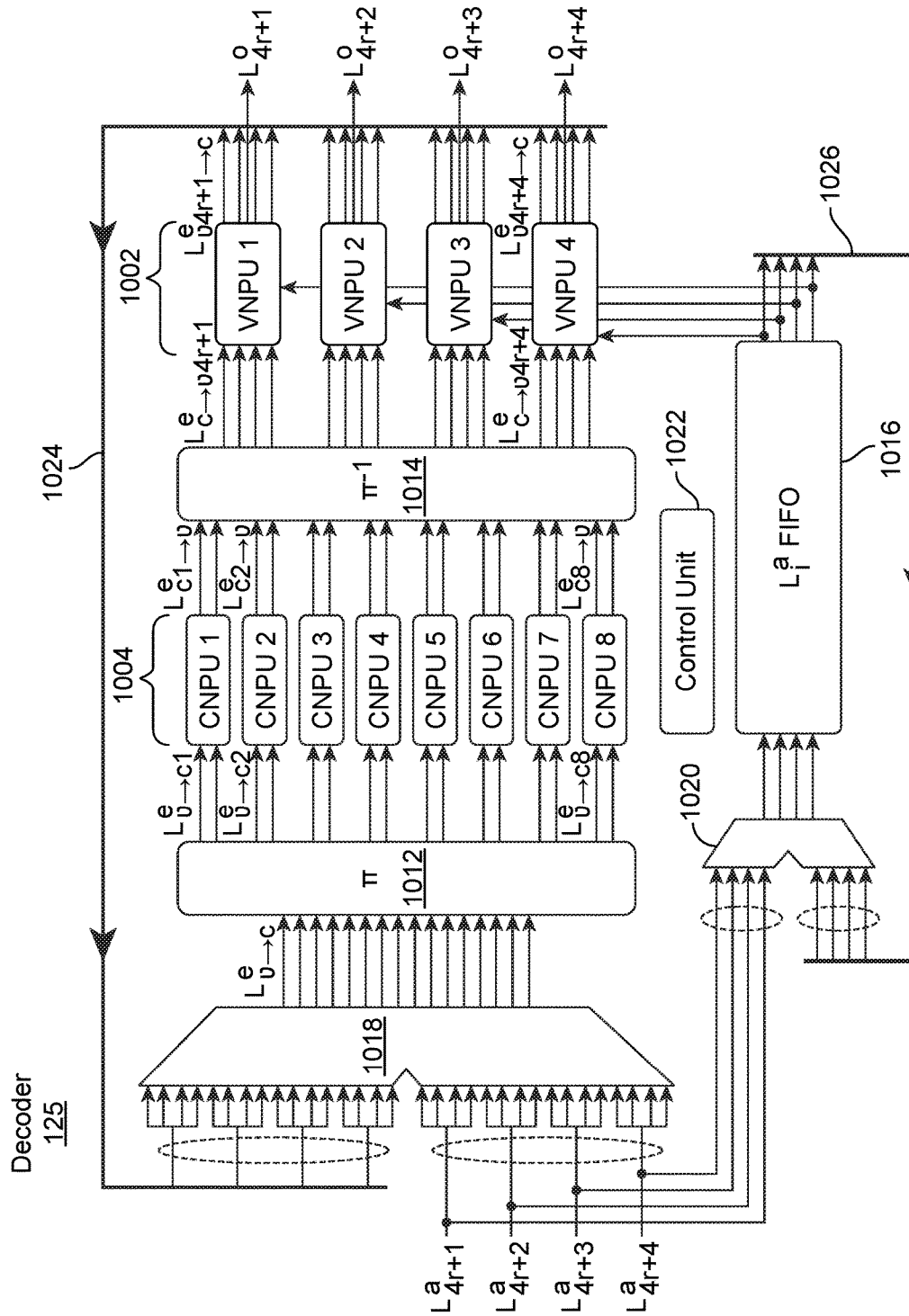
FIG. 10 is an example embodiment of a decoder architecture for decoding LDPC codes.

The constraint imposed by RCP allows an efficient partial parallel implementation of the decoding algorithm. An example embodiment of a parallel pipelined decoding architecture is illustrated in FIG. 10 for the example case where q=4 as in the matrix H of FIG. 6. The decoder 125 includes a first-in-first-out (FIFO) memory 1016 that stores the a-priori LLRs, permutation blocks $\Pi$ 1012 and $\Pi^{-1}$ 1014, parallel VNPUs 1002, serial, parallel, or semi-parallel CNPUs 1004, a control unit 1022, and multiplexers 1018, 1020. The permutation blocks 1012, 1014 can be implemented with multiplexers (if the permutation is not constant, i.e. the sub-matrices $H^{(r)}$ are not equal) or they can be implemented as wires. The control unit 1022 generates control signals utilized by the other blocks of the decoder 125. In particular, the control unit 1022 controls the permutation blocks 1012, 1014, and turns on and off post-processing algorithms (which are implemented by the VNPUs 1002 or the CNPUs 1004) that will be described in further detail below. The control unit 1022 also controls the computations and memories inside the CNPUs 1004 and controls the select lines of the multiplexers 1018, 1020.

Each iteration of the iterative decoding algorithm is divided into $\mu$ steps with each step corresponding to one of the sub-matrices of H. At the r-th step, only the messages related to the sub-matrix $H^{(r)}$ are computed. Thus, for example, at a first step (r=0), the decoder 125 receives LLRs from Eq. (4) corresponding to the first q bits (e.g., q=4) of a codeword (e.g., bits corresponding to $v_1$, $v_2$, $v_3$, $v_4$ of the first sub-matrix $H^{(0)}$). The multiplexer 1018 and permutation block 1012 operate to select the appropriate inputs to each of the CNPUs 1004 to perform the computation of Eq. (8), (9) or (10A)-(10E) (depending on the particular implementation used). In one embodiment, the permutation block 1012 comprises a barrel shifter. The CNPUs 1004 perform the check node computation of Eqs. (8), (9), or (10A)-(10E) with each CNPU 1004 corresponding to a different parity check (row of $H^{(r)}$ for the sub-matrix r being processed). In this embodiment, eight CNPUs 1004 operate in parallel corresponding to each of the rows (check nodes) of H. In one embodiment, the number of input messages $L_{v_i \to c_j}^e$ and output messages $L_{c_j \to v_i}^e$ that each CNPU 1004 can compute per clock cycle is equal to the number of '1s' in the corresponding row of the sub-matrix being processed. If the CNPU 1004 computes only one input and one output messages per clock cycle it is called a serial CNPU. If it computes more than one (but lower than the total number of 1s in the corresponding row of H) input and output messages per clock cycle it is called a semi-parallel CNPU. Furthermore, in one embodiment, each CNPU 1004 can operate on two different received codewords at a time using, for example, the CNPU architecture of FIG. 9 described above. For example, in one embodiment, the minimum computation unit 902 and the sign product computation unit 904 of FIG. 9 can operate on one codeword while the output computation unit 910 operates on a different codeword. The CNPU supports two different codewords because the minimum computation unit 902 and the output computation unit 910 are isolated by the implementation of the two message memories 906 and 908.

Inverse permutation block 1014 (e.g., a barrel shifter) receives the outputs of the CNPUs 904 and provides appropriate inputs to the VNPUs 1002 for carrying out the computation of Eq. (5) and Eq. (7). In one embodiment, the decoder 125 has q parallel VNPUs 902 (e.g., q=4) corresponding to the q columns (variable nodes) of each sub-matrix of H. In one embodiment, the complexity is reduced because only q (and not n) parallel VNPUs 1002 are implemented, i.e., it is not necessary to implement one VNPU per variable node. Multiplexer 1020 provides LLR values to FIFO register 1016 which outputs these to the VNPUs 1002 at the appropriate time to compute Eq. (5) and Eq. (7). Feedback paths 1024, 1026 provide intermediate values to the beginning of the pipeline to perform additional iterations of the iterative decoding process.

The decoder architecture of FIG. 10 beneficially allows the decoder 125 to reuse the same q VNPUs 1002 at each step, reducing μ times the associated hardware. Furthermore, the interconnection complexity is also reduced because the interconnection network is associated with the non-zeros entries of $H^{(r)}$, which is μ times smaller than that of the original H. The blocks of the CNPU 904 are simplified since the recursive computation of the check node equation (8) has significant lower complexity than a full-parallel implementation. Furthermore, the recursive CNPU 1004 stores only two minimum values which are the outputs of equations (10B) and (10C), in one embodiment. Therefore, it is not necessary to store all $L^e$ messages. This reduces the memory requirements of the decoder 125.

In one embodiment, the decoder architecture of FIG. 10 efficiently performs the iterative decoding process by processing multiple codewords. For example, rather than processing all of the iterations of one codeword and then going to the next codeword, the decoder instead processes one iteration of a first codeword, then one iteration of a second codeword and so on up to an $N^{th}$ codeword. Then, the decoder processes the next iteration of the first codeword, and so on. Note that two codewords can be processed at the same time by different blocks of the decoder (for instance, the minimum computation unit 902 and the output computation unit 910 can process different codewords at the same time). This modification can be combined with early termination (i.e., a variable number of iterations is performed on each codeword depending on the outcome of the parity check). In this embodiment, when the decoding process of one of the N codewords is completed, a new codeword can replace it while the other codewords continue the decoding process. Thus, the decoder need not necessarily wait until all the N codewords are decoded in order to introduce new codewords to the decoder.

For example, when the multiplexers 1018, 1020 close the decoder loop, there may be two codewords stored in the decoder: e.g., codeword A and codeword B. The output computation unit 910 of the CNPU 1004 read the information of the codeword A from the message memory 908 (see FIG. 9) and computes the messages $L_{c_j \to v_i}^e$ of codeword A. These messages are passed to the VNPU 1002 through the permutation block 1014. The VNPU 1002 computes the messages $L_{v_i \to c_j}^e$ of codeword A. These messages return to the CNPU 1004 through the multiplexer 1018 and the permutation block 1012. All these blocks (1014, 1002, 1018, 1012) may introduce a latency (for example, due to their pipeline implementation). Because of this latency, the minimum computation unit 902 does not start processing until the new $L_{v_i \to c_j}^e$ arrived. Therefore, if the decoder 125 supported only one codeword, the output computation unit 910 may finish before the minimum computation unit 902 has finished and the output computation unit 910 would have to wait for the minimum computation unit 902 to finish its process. This waiting time would reduce the computation speed of the decoder 125. In order to avoid this penalty, two (or more) codewords are stored in the decoder loop. As soon as the output computation unit 910 finishes the computation process of one codeword, for example codeword A, it can start with the computation of the other codeword, for example codeword B, which was stored in the message memory 906. This is done by copying the contents of memory 906 to memory 908. Later, when the minimum computation unit 902 finishes its computation process of the codeword A, it stores the results in the message memory 906 and it can immediately starts the computation process of codeword B. If the total latency of blocks 1014, 1002, 1018, 1012, and 904 is higher than the number of sub-matrices, more than two codewords may be decoded and stored at the same time in order to avoid the above described waiting time. This can be done by increasing the number of message memories (in a serial FIFO concatenation) inside the CNPU 1004.

Figure 11A:
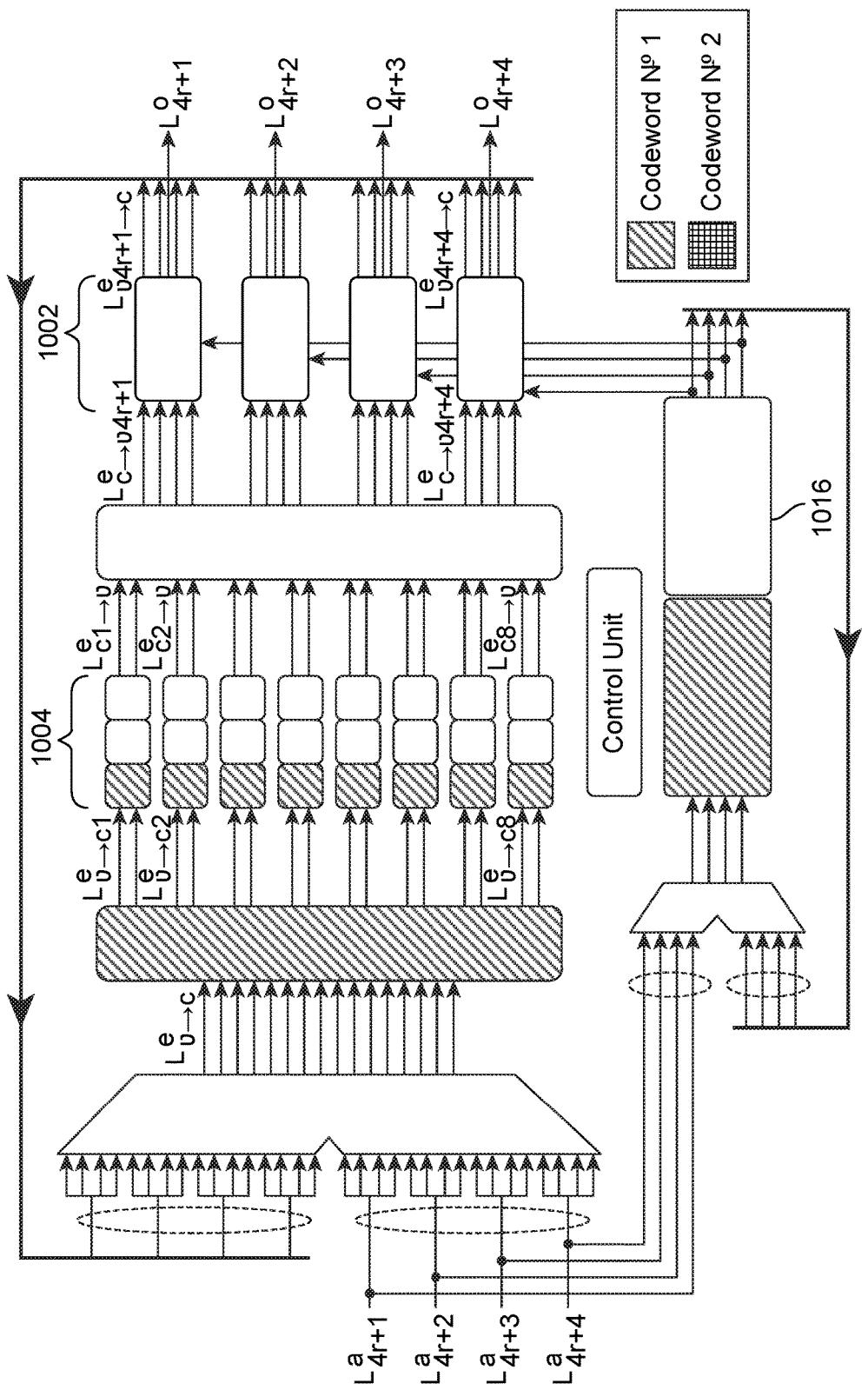
FIG. 11A is an example embodiment of a first step of information flow through a decoder architecture for decoding LDPC codes.
Figure 11B:
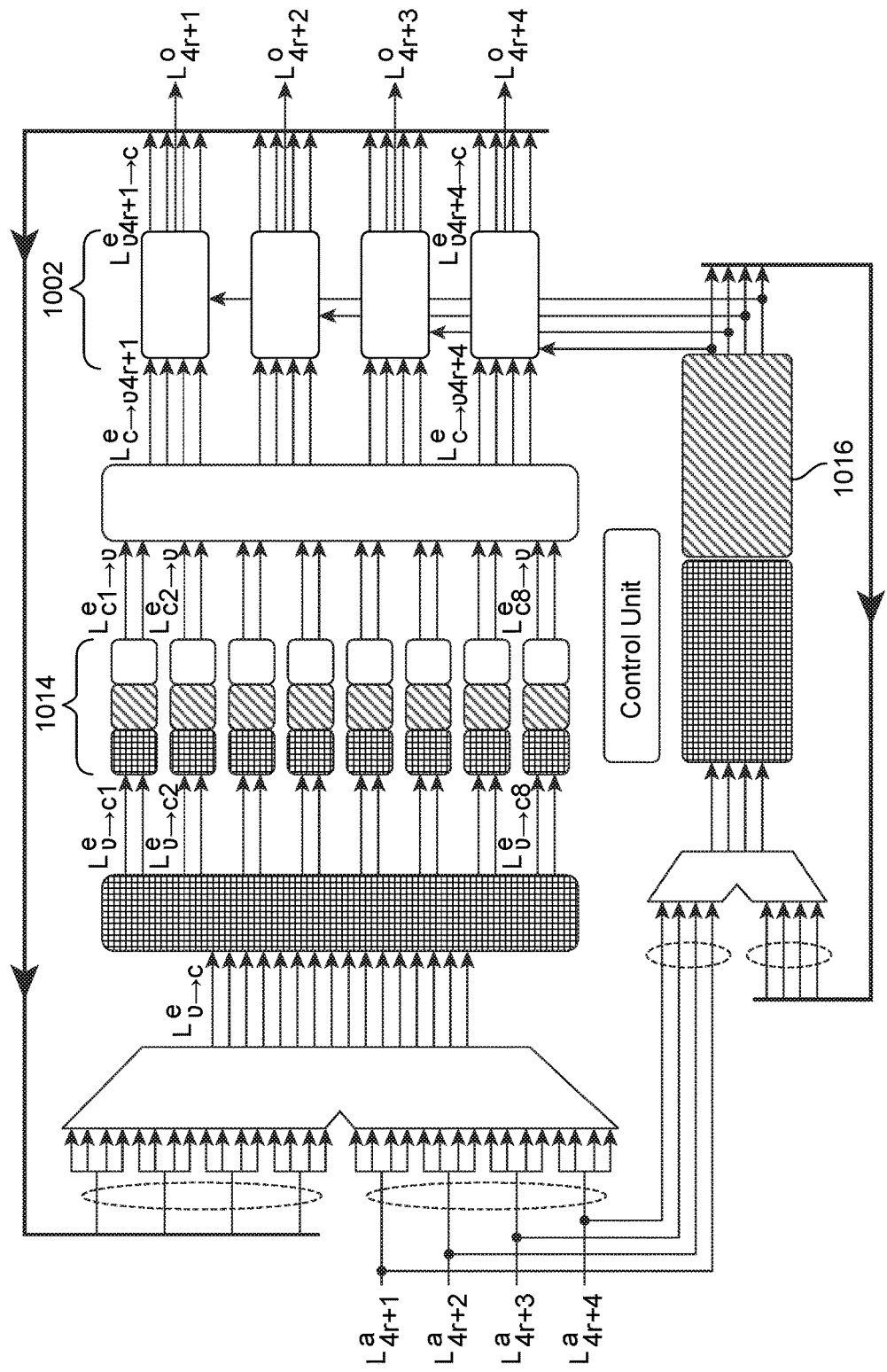
FIG. 11B is an example embodiment of a second step of information flow through a decoder architecture for decoding LDPC codes.
Figure 11C:
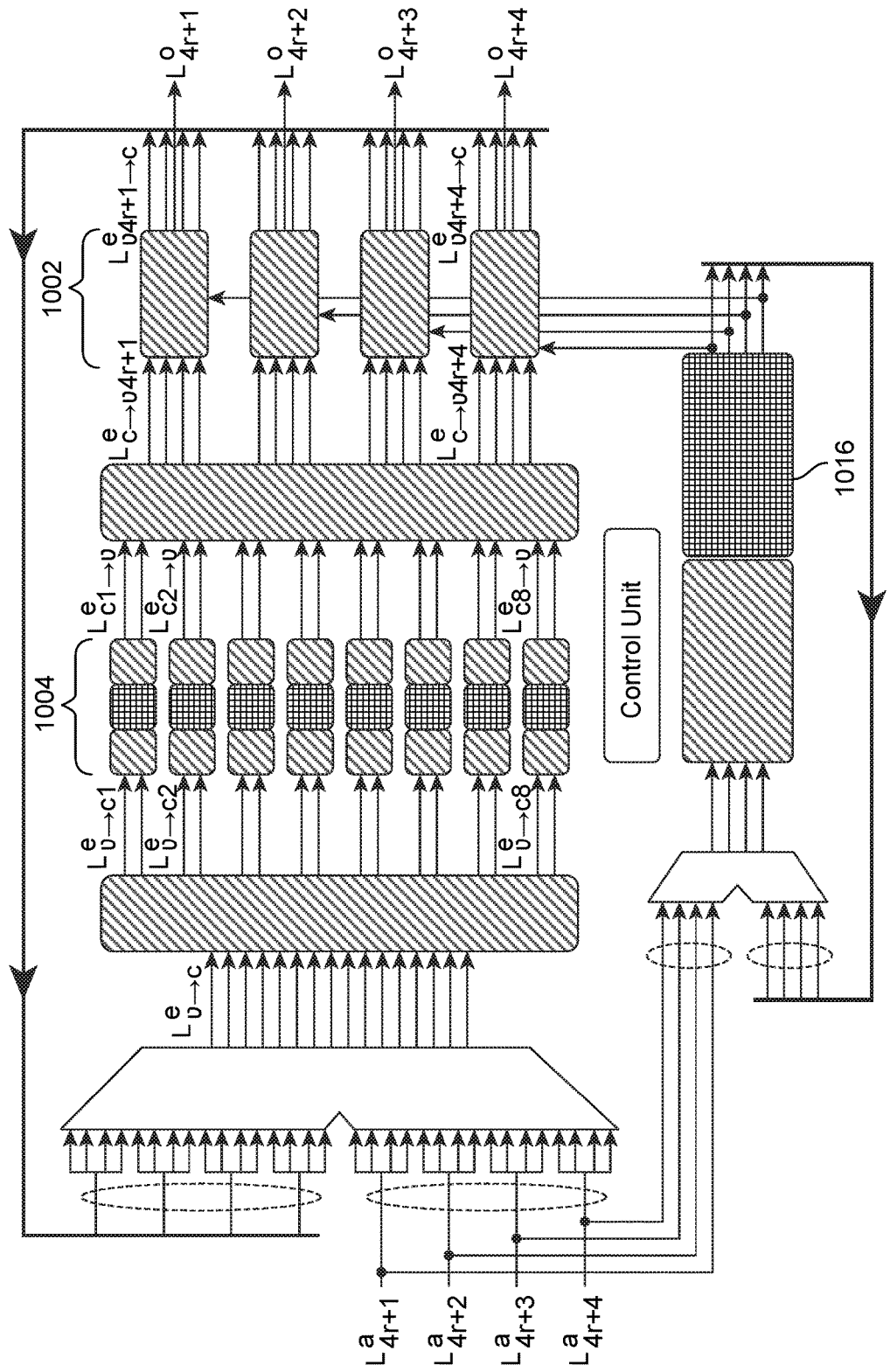
FIG. 11C is an example embodiment of a third step of information flow through a decoder architecture for decoding LDPC codes.
Figure 11D:
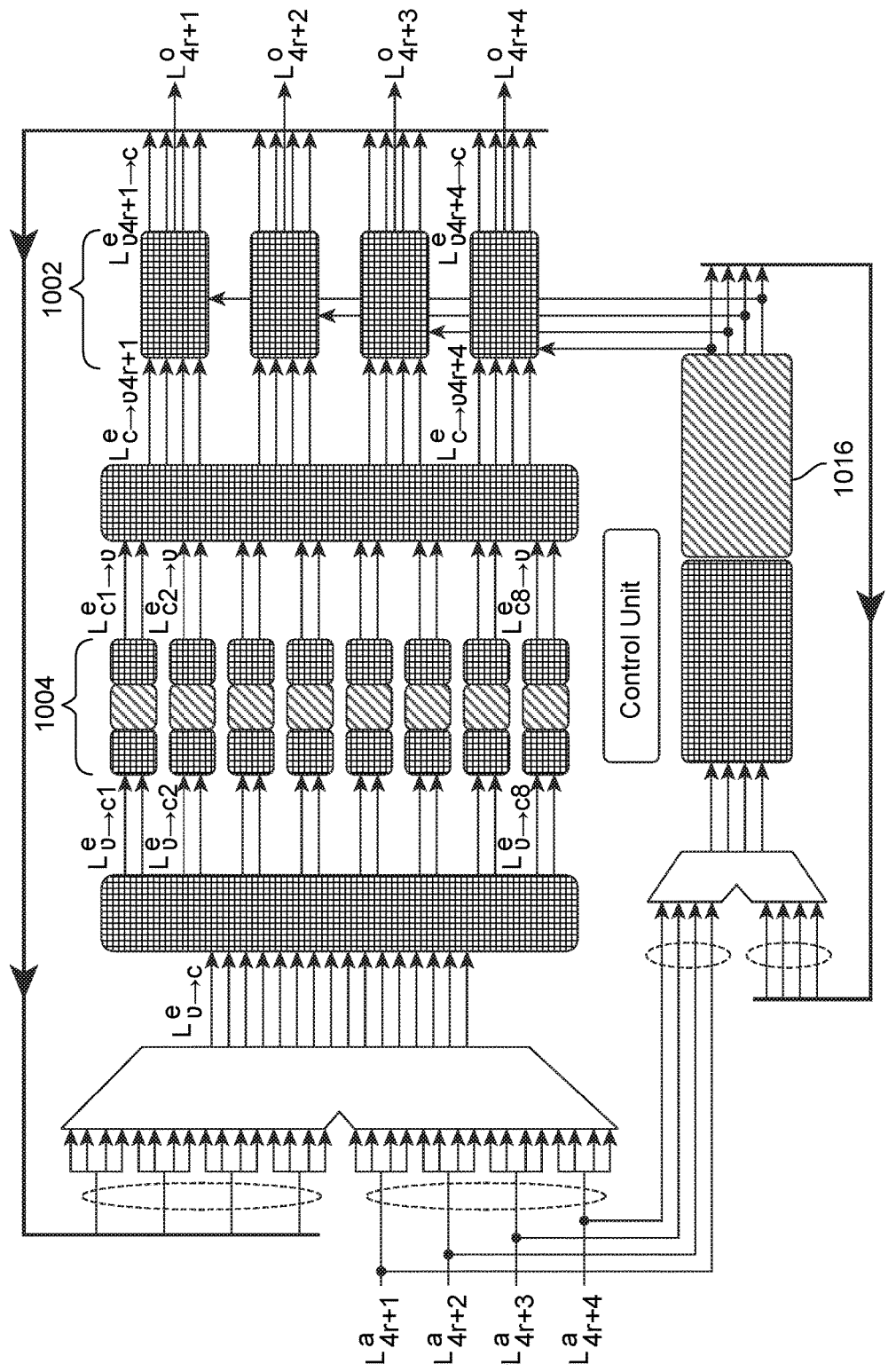
FIG. 11D is an example embodiment of a fourth step of information flow through a decoder architecture for decoding LDPC codes.

FIG. 11A-D illustrate flow of information through the pipelined decoder architecture of FIG. 10 in which the decoder processes two codewords in parallel. The CNPUs 1004 showed in FIG. 11A-D are divided in 3 sub-blocks. The first (left) sub-block corresponds to the minimum computation unit 902, the sign product computation unit 904, and part of the FIFO unit 912 showed in FIG. 9. The second (center) sub-block corresponds to the message memory 1 906 showed in FIG. 9. The third (right) sub-block corresponds to the message memory 2 908, the output computation unit 910 and part of the FIFO 912. In FIG. 11A, a first iteration of a first codeword (e.g., q LLR) is passed in μ clock cycles to the CNPUs 1004 and enter the FIFO register 1016. After that, in FIG. 11B, the first iteration of the first codeword moves forward in the internal pipelines of the CNPUs 1004 and a first iteration of a second codeword is passed to the CNPUs 1004. Furthermore, the first iteration of the second codeword enters the FIFO register 1016 and the first iteration of the first codeword moves forward in the FIFO register 1016. After that, in FIG. 11C, the first iteration of the first codeword is passed from the CNPUs 1004 to the VNPUs 1002. The first iteration of the second codeword moves forward in the CNPU 1004 pipelines and in the FIFO register 1016. A second iteration of the first codeword enters the CNPU 1004 and the FIFO register 1016. After μ clock cycles, in FIG. 11D, the first iteration of the second codeword is passed from the CNPUs 1004 to the VNPUs 1002. The second iteration of the first codeword moves forward in the CNPU 1004 pipeline and FIFO register 1016. A second iteration of the second codeword enters the CNPU 1004 and FIFO register 1016. As will be apparent, the process described above can be extended to N codewords for any integer N.

Example Performance Measurements

In one embodiment, performance of the LDPC codewords can be evaluated using a combination of analytical tools and simulation (e.g., using a field-programmable gate array or other device). For example, in one embodiment, simulations in the proximity of the low BER region of interest (e.g., $\geq 10^{-13}$) could be used to obtain dominant trapping sets. Based on these trapping sets, BER can be estimated by using importance sampling technique.

Let $r_a$ and $r_e$ be the number of bits used to represent the prior LLRs and the messages from both check and variables nodes, respectively. In one embodiment, the prior LLRs are quantized (e.g., using $r_a=5$ bits). Furthermore, in one embodiment, the decoder is implemented using $r_e=5$ bits. To obtain the perform measures, an all-zeros codeword can be transmitted using binary phase-shift keying (BPSK) modulation (i.e., bits $\{0, 1\}$ are mapped into symbols $\{+1, -1\}$ for transmission). An additive white Gaussian noise (AWGN) channel can also be implemented to model channel noise by using a random number generator.

Figure 12A:
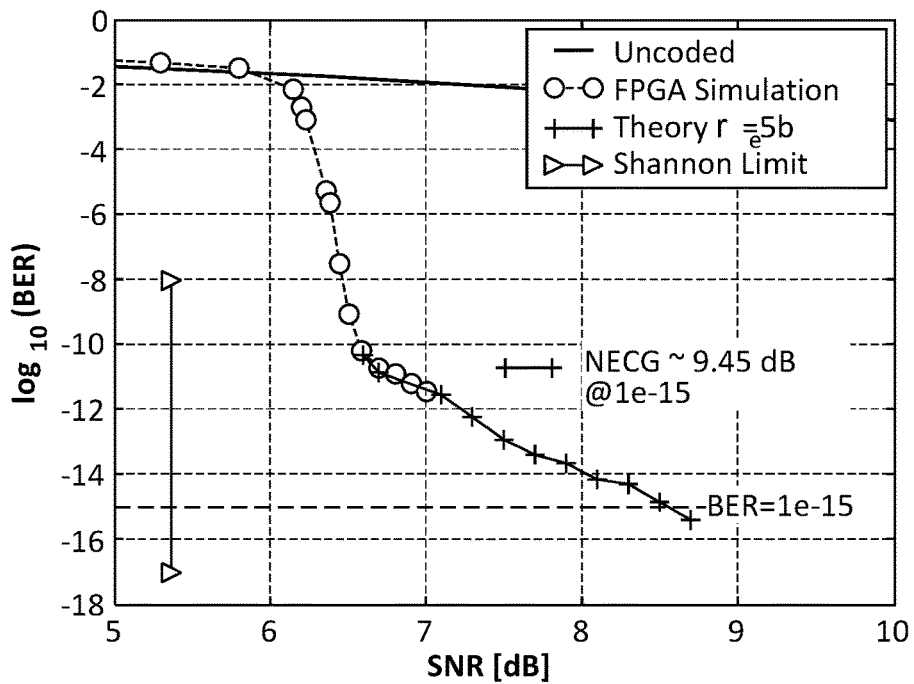
FIG. 12A is a first performance graph for a set of example LDPC codes.
Figure 12B:
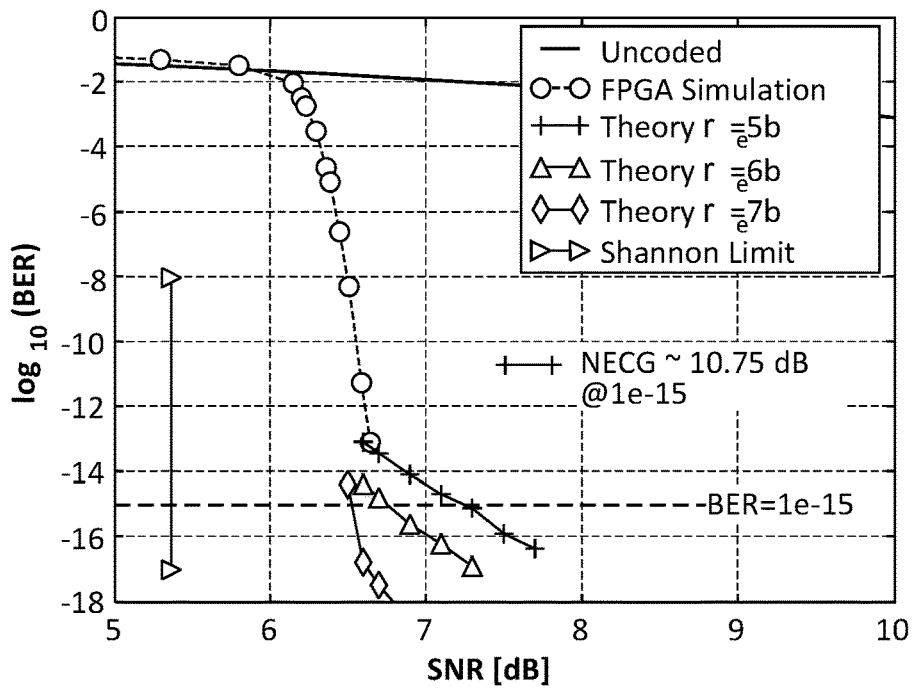
FIG. 12B is a second performance graph for a set of example LDPC codes.
Figure 12C:
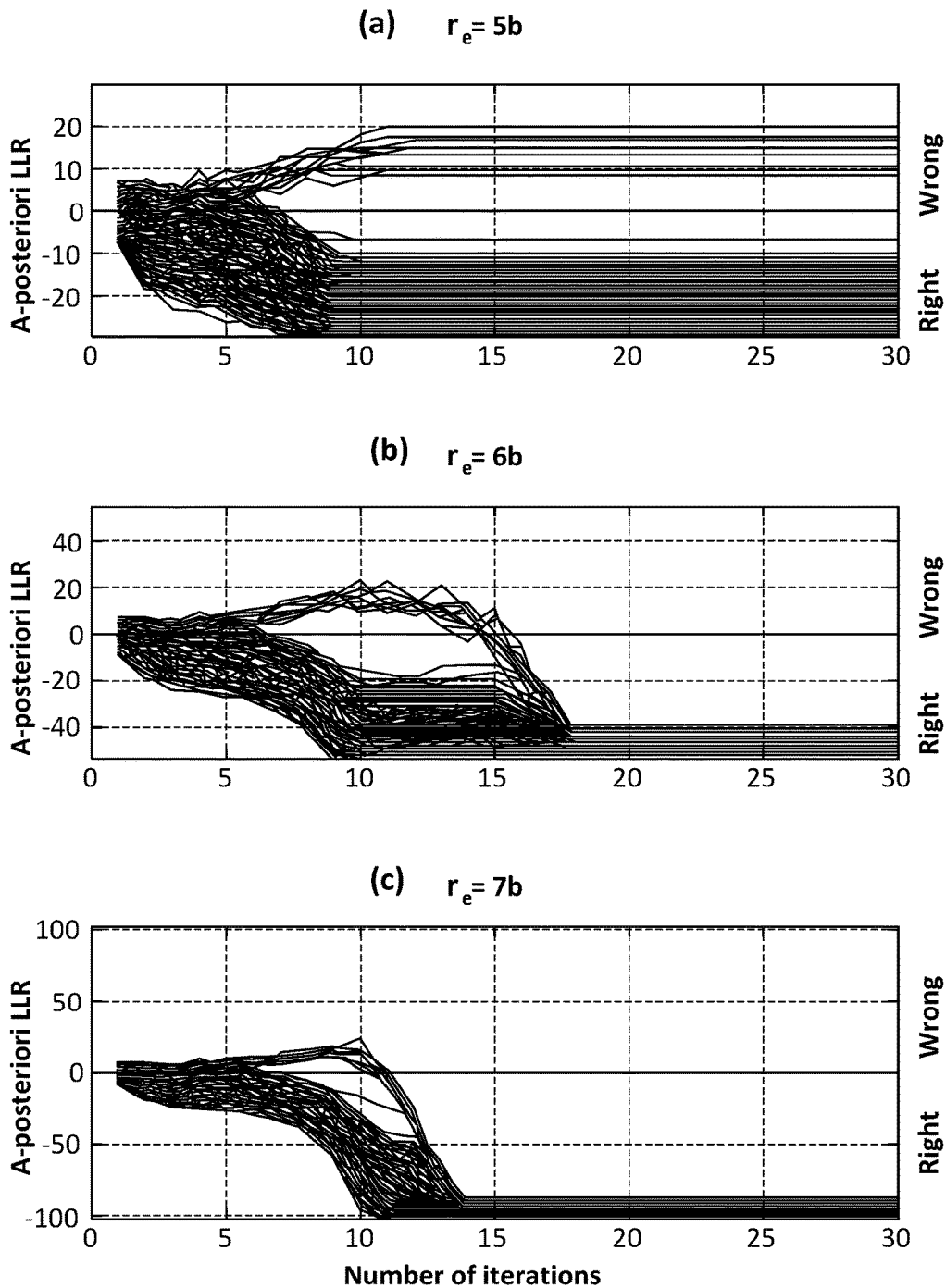
FIG. 12C is a third performance graph for a set of example LDPC codes.

FIGS. 12A-12C illustrate performance results for an example implementation of the decoder 125. FIG. 12A depicts the BER versus the signal-to-noise ratio (SNR) for code $C_1$ described above with 13 iterations of the decoding algorithm. The curve shows an error floor at BER=$10^{-11}$ with an NECG of 9.45 dB at BER=$10^{-15}$. This error floor is caused by the presence of several absorbing sets (AS) created by the combination of cycles of length 6.

FIG. 12B shows the performance of code $C_2$ described above. No error floor is observed up to $10^{-13}$ and the expected NEGC is 11.30 dB. However, from importance sampling analysis, a quantization sensitive error floor below $10^{-13}$ can be estimated. This error floor is caused by the combination of a (12,8) absorbing set and the quantization of the $L^e$ messages in the SMSA. FIG. 12B shows the estimated error floor for $r_e$=5, 6, and 7 bits with 13 iterations. The a-posteriori LLR evolution of the (12, 8) absorbing set is shown in FIG. 12C. (In the notation, "(e, d) absorbing set, e is the number of wrong bits and d is the number of unsatisfied check nodes). Note that the SMSA decoder with $r_e$=5 bits does not resolve the (12,8) absorbing set independently of the number of iterations. On the other hand, the SMSA decoder takes 17 and 12 iterations with $r_e$=6 and 7 bits, respectively.

Min-Sum Algorithm with Adaptive Quantization

A common problem with decoders based on SPA, MSA or its variations is that error floors tend to arise. These error floors can be challenging to estimate and reduce particularly at very low levels (e.g., below $10^{-13}$). As shown above, very low error floors (e.g., below $10^{-13}$) may be caused by quantization effects. In order to effectively combat these low error floors, a post-processing technique may be applied.

In one embodiment, the performance limitations described above can be improved using a real-time adaptive quantization scheme. The real-time adaptive quantization scheme combats error floor exacerbation caused by a low precision implementation of the decoder 125. The decoder 125 applies real-time adaptation of the fractional point position in the fixed point representation of the internal MSA messages, keeping constant the total number of bits.

The adaptive quantization algorithm applies a scaling to the log-likelihood ratios (LLRs) and messages in order to increase the range of representation, and therefore reduce the saturation effects. In one embodiment, this scaling step is activated only when a predefined activation condition is met. For example, in one embodiment, the scaling is applied when the number of unsatisfied check nodes do not exceed a minimum value $d_t$ (e.g., d=8 or d=9 for a (12, 8) absorbing set). A check node is unsatisfied if its corresponding parity equation (i.e. a row of the parity check matrix H) is unsatisfied according to the sign value of the a posteriori output of the decoder at that state. This activation condition usually occurs only after some normal iterations without scaling. Note that since the total number of bits is maintained constant, this wider range is obtained at the expense of an increase in quantization.

The fixed-point modification increases the dynamical range of the decoder messages (by increasing the quantization step). In one embodiment, the quantization change is implemented in the VNPU 1002 after summation because here messages achieve their highest value, and the saturations have the stronger distortion effect.

The scaling step can be generalized and implemented inside the VNPU 1002 as:

$$L_{v_i \to c_j}^e = \kappa_1^t \cdot L_i^a + \kappa_2 \cdot \left( \sum_{c_k \in c_{(v_i) \backslash c_j}} L_{c_k \to v_i}^e \right), \quad (11)$$

where t=1, 2, . . . , denotes the number of the extra iteration used for post-processing. Factors $\kappa_1$ and $\kappa_2$ are positive gains smaller than unity.

In one embodiment, to simplify the implementation, $\kappa_1=\kappa_2=\kappa$ can be used. Thus, the algorithm reduces to scale by $\kappa$ both the output of the variable-node equation (Eq. (5)) and the prior LLR. This is shown as:

$$L_{v_i \to c_j}^e = \kappa \cdot \left( L_i^a + \sum_{c_k \in c_{(v_i) \backslash c_j}} L_{c_k \to v_i}^e \right), \quad (12)$$

$$L_i^a \leftarrow \kappa \cdot L_i^a. \quad (13)$$

Note that the prior information is gradually reduced to zero as the adaptive quantization process evolves. After a given number of iterations, the MSA operates without prior information. In one embodiment, $\kappa=\frac{1}{2}$ provides a good tradeoff between performance and implementation complexity.

Figure 13A:
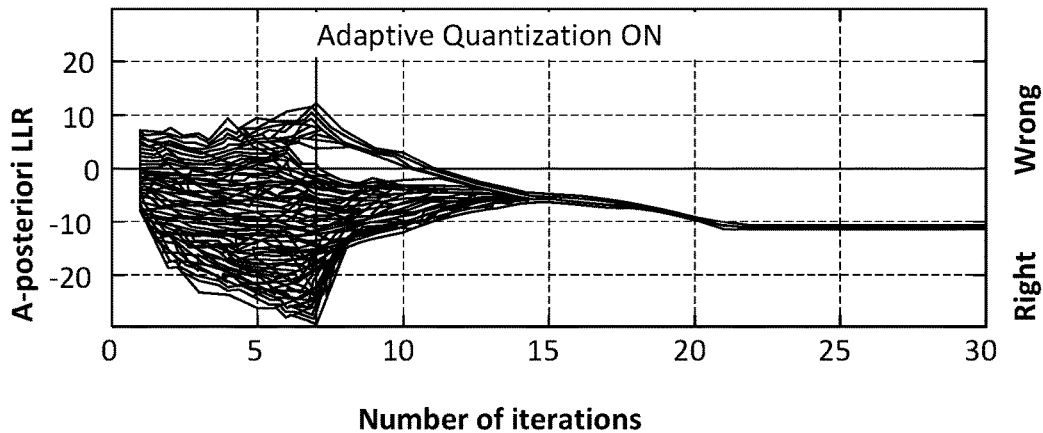
FIG. 13A is a first performance graph for a set of example LDPC codes using adaptive quantization decoding.
Figure 13B:
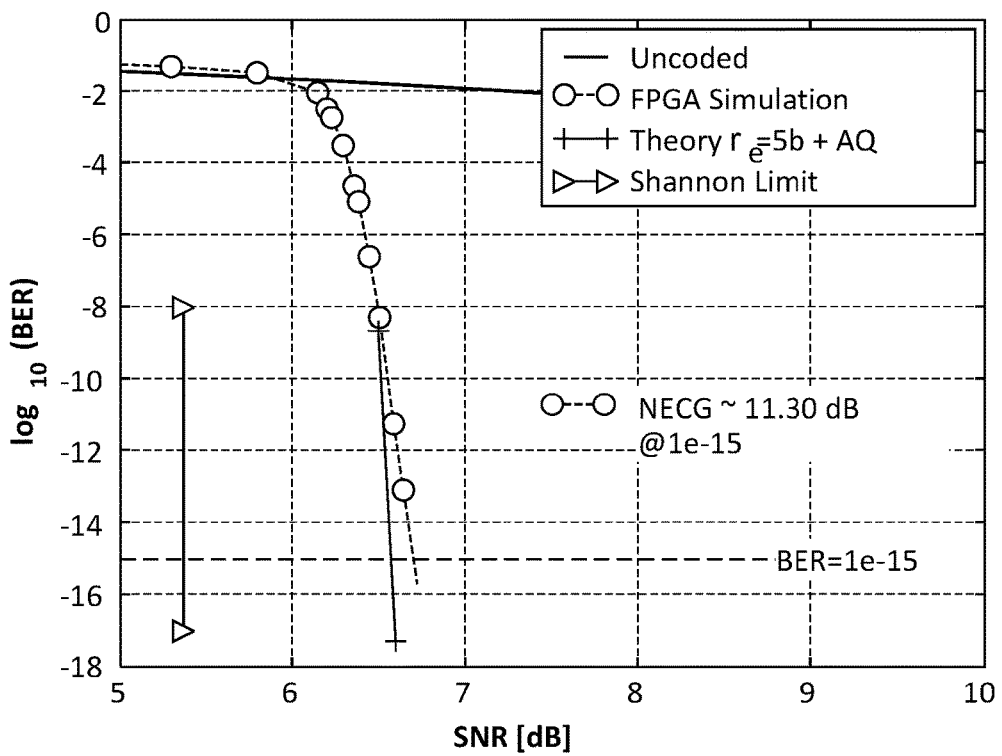
FIG. 13B is a second performance graph for a set of example LDPC codes using adaptive quantization decoding.

FIGS. 13A-13B illustrate performance of the decoder using the adaptive quantization algorithm. In FIG. 13A, the a-posteriori LLR evolution of the SMSA decoder for code $C_2$ is shown with $r_e$=5 bits over the (12,8) absorbing set. Note that the absorbing set can be resolved with 5-6 extra iterations. FIG. 13B shows the estimated BER versus SNR derived with $r_e$=5 bits and the adaptive quantization algorithm. As can be seen, the error floor observed in FIG. 12B is corrected by the adaptive quantization algorithm.

Using the RCP-QC-LDPC codes and the adaptive quantization technique described above, the complexity of the decoding can be substantially reduced (e.g., to about 5 extra iterations under some conditions. Furthermore, the error floors can be drastically lowered, resulting in an expected NECG≥11.30 dB or better at a BER of $10^{-15}$ in some embodiments. Furthermore, the described approach beneficially avoids a hard-decision-based block outer code and reduces the block size significantly relative to prior techniques. This reduction of complexity and the concomitant reduction of latency can be an important factor for commercial applications, thereby enabling applications such as 100 Gb/s optical transport networks.

In some embodiments, these codes can achieve an expected coding gain of, for example, 11.30 dB at $10^{-15}$, 20% OH, and a block size of 24576 bits. In other embodiments, the codes can achieve an expected coding gain of, for example, 11.2 dB at $10^{-15}$, 18.18% OH, and a block size of 26624 bits. In yet other embodiments, the codes can achieve an expected coding gain of, for example, 11.1 dB at $10^{-15}$, 16.66% OH, and a block size of 28672 bits. The described code beneficially can minimize the BER floor while simultaneously reducing the memory requirements and the interconnection complexity of the iterative decoder. Under certain conditions, the described codes can achieve NECG of 10.70 dB at a BER of $10^{-13}$ and no error floors.

Although the detailed description contains many specifics, these should not be construed as limiting the scope of the invention but merely as illustrating different examples and aspects of the invention. It should be appreciated that the scope of the invention includes other embodiments not discussed in detail above. For example, the functionality has been described above as implemented primarily in electronic circuitry. This is not required, various functions can be performed by hardware, firmware, software, and/or combinations thereof. Depending on the form of the implementation, the "coupling" between different blocks may also take different forms. Dedicated circuitry can be coupled to each other by hardwiring or by accessing a common register or memory location, for example. Software "coupling" can occur by any number of ways to pass information between software components (or between software and hardware, if that is the case). The term "coupling" is meant to include all of these and is not meant to be limited to a hardwired permanent connection between two components. In addition, there may be intervening elements. For example, when two elements are described as being coupled to each other, this does not imply that the elements are directly coupled to each other nor does it preclude the use of other elements between the two. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

The invention claimed is:

1. A decoder for decoding forward error correcting codewords using a parity check matrix comprising a plurality of sub-matrices, the decoder comprising:
    a plurality of check node processing units to receive a forward error correction codeword and to each perform, in parallel, a check node computation on the forward error correction codeword using a different row of the parity check matrix, each of the plurality of check node processing units comprising:
        an input computation stage to compute initial computation values from a plurality of variable node messages, the input computation stage comprising,
            a minimum computation unit determining a first minimum value and a second minimum value of the variable node messages and determining an identity of a variable node corresponding to the first minimum value; and
            a sign product computation unit determining a product of signs of the variable node messages received from the plurality of variable nodes;
        a pipelined message memory having at least two memory stages, the pipelined message memory to receive the initial computation values at an initial memory stage of the message memory and to shift the initial computation values to a subsequent memory stage in the pipelined message memory at a predefined clock interval;
        an output computation stage to receive the initial computation values from a final memory stage of the pipelined message memory and to generate a plurality of check node output messages;
    a plurality of variable node processing units, each variable node processing unit to receive the plurality of check node messages and to perform variable node update computations corresponding to different columns belonging to a same sub-matrix of the parity check matrix to generate the variable node messages; and
    an output circuit to receive the variable node messages and to generate a decoded codeword based on the variable node messages.

2. The decoder of claim 1, wherein at a given time instance, the input computation stage computes initial computation values associated with a second iteration of an iterative decoding algorithm applied to a first codeword, the pipelined message memory stores initial computation values for a first iteration of the iterative decoding algorithm applied to a second codeword, and the output computation stage computes a plurality of check node output messages associated with a first iteration of the iterative decoding algorithm applied to the first codeword.

3. The decoder of claim 1, wherein the parity check matrix is row-regular and column-regular such that the parity check matrix has a first same number of 1s in each row and a second same number of 1s in each column.

4. The decoder of claim 1, wherein the parity check matrix is quasi-cyclic such that a circular shift of a valid codeword by an integer amount results in another valid codeword.

5. The decoder of claim 1, wherein the parity check matrix comprises an array of circulant sub-matrices, wherein each of the circulant sub-matrices comprises a square matrix in which a first row is a cyclic shift of a last row, and each other row is a cyclic shift of a row directly above it.

6. The decoder of claim 1, wherein the parity check matrix comprises an array of circulants, each circulant having 2048 rows and 2048 columns of values, and each circulant having two non-zero diagonals, wherein each of the array of circulants comprises a square matrix in which a first row is a cyclic shift of a last row, and each other row is a cyclic shift of a row directly above it, wherein the array of circulants comprises one of a 2×12 array, a 2×13 array, and a 2×14 array.

7. The decoder of claim 1, wherein the forward error correcting codeword has a length comprising a first integer multiple of a power of 2, and wherein the decoder outputs a decoded codeword having an effective code dimension of a second integer multiple of the power of 2.

8. The decoder of claim 7, wherein the output circuit generates the decoded codeword to have a padded code dimension, and discards a plurality of symbols of the decoded codeword to reduce a code-dimension from a padded code dimension to the effective code dimension.

9. The decoder of claim 8, wherein each of the forward error correcting codewords has a code-length of 24576 symbols, a padded code dimension of 20482 symbols, and an effective code dimension of 20480.

10. The decoder of claim 8, wherein each of the forward error correcting codewords has a code-length of 26624 symbols, a padded code dimension of 22530 symbols, and an effective code dimension of 22528.

11. The decoder of claim 8, wherein each of the forward error correcting codewords has a code-length of 28672 symbols, a padded code dimension of 24578 symbols, and an effective code dimension of 24576.

12. The decoder of claim 1, wherein the forward error correcting codewords have an expansion ratio of 12/10, wherein the expansion ratio comprises a ratio of a code-length to an effective code dimension.

13. The decoder of claim 1, wherein the forward error correcting codewords have an expansion ratio of 13/11, wherein the expansion ratio comprises a ratio of a code-length to an effective code dimension.

14. The decoder of claim 1, wherein the forward error correcting codewords have an expansion ratio of 14/12, wherein the expansion ratio comprises a ratio of a code-length to an effective code dimension.

15. The decoder of claim 1, further comprising a control unit configured to determine if an activation criteria is met and responsive to the activation criteria being met, control the decoder to adaptively quantize the variable node messages.

16. The decoder of claim 15, wherein the control unit is configured to adaptively quantize the variable node messages by scaling the variable node messages by scaling factors to increase a representation range given a fixed number of bits.

17. The decoder of claim 1, wherein each of the check node processing units further comprise:
   a sign FIFO unit storing the signs of the variable node messages from the plurality of variable node processing units; and
wherein the output computation stage computes the plurality of check node messages based on the signs of the variable node messages from the sign FIFO unit, the first and second minimum values, an identity of the variable node processing unit circuit corresponding to the first minimum value, and a product of the signs of the variable node messages.

* * * * *